United States Patent
Landa et al.

(10) Patent No.: US 12,446,160 B2
(45) Date of Patent: Oct. 14, 2025

(54) APPLICATION OF ELECTRICAL CONDUCTORS TO AN ELECTRICALLY INSULATING SUBSTRATE

(71) Applicant: LANDA LABS (2012) LTD, Rehovot (IL)

(72) Inventors: Benzion Landa, Nes Ziona (IL); Naomi Elfassy, Jerusalem (IL); Stanislav Thygelbaum, Bat Yam (IL)

(73) Assignee: Landa Labs (2012) LTD., Rehovot (IL)

( * ) Notice: Subject to any disclaimer, the term of this patent is extended or adjusted under 35 U.S.C. 154(b) by 0 days.

(21) Appl. No.: 18/198,791

(22) Filed: May 17, 2023

(65) Prior Publication Data

US 2023/0292445 A1   Sep. 14, 2023

Related U.S. Application Data

(60) Continuation of application No. 17/132,472, filed on Dec. 23, 2020, now Pat. No. 11,832,395, which is a
(Continued)

(30) Foreign Application Priority Data

Jul. 28, 2016 (GB) .................................. 1613051
Jun. 14, 2017 (GB) .................................. 1709427

(51) Int. Cl.
*H05K 1/02* (2006.01)
*B41M 1/12* (2006.01)
(Continued)

(52) U.S. Cl.
CPC ............. *H05K 3/207* (2013.01); *B41M 1/12* (2013.01); *H05K 1/0393* (2013.01); *H05K 1/092* (2013.01);
(Continued)

(58) Field of Classification Search
CPC ........... H05K 1/02; H05K 1/028; H05K 1/03; H05K 1/0306; H05K 1/0393; H05K 1/09;
(Continued)

(56) References Cited

U.S. PATENT DOCUMENTS 3,973,745 A * 8/1976 Coltrin ................. B64G 1/2224
244/172.6
4,039,371 A * 8/1977 Brunner ............ H01L 21/31133
257/E21.255
(Continued)

*Primary Examiner* — Timothy J. Dole
(74) *Attorney, Agent, or Firm* — Shalom Wertsberger; Saltamar innovations

(57) ABSTRACT

A method for applying an electrical conductor to an electrically insulating substrate, the method comprising providing a flexible membrane with a pattern of grooves formed on a first surface thereof, and loading the grooves with a composition comprising particles of a conductive material. The composition is, or may be made, electrically conductive. Once the membrane is loaded, the grooved first surface of the membrane is brought into contact with a front or/and back surface of the substrate. A pressure is then applied between the substrate and the membrane(s) so that the composition loaded into the grooves adheres to the substrate. The membrane(s) may remain on the electrically insulating substrate. The electrically conductive particles in the composition can then be sintered to form a pattern of electrical conductors on the substrate, the pattern corresponding to the pattern formed in the membrane(s).

20 Claims, 7 Drawing Sheets

Related U.S. Application Data continuation of application No. 16/831,794, filed on Mar. 26, 2020, now abandoned, which is a division of application No. 16/258,851, filed on Jan. 28, 2019, now Pat. No. 10,645,815, which is a continuation-in-part of application No. PCT/IB2017/054629, filed on Jul. 28, 2017.

(51) Int. Cl.

| | | |
|---|---|---|
| *H05K 1/03* | (2006.01) | |
| *H05K 1/09* | (2006.01) | |
| *H05K 3/20* | (2006.01) | |
| *H05K 3/28* | (2006.01) | |
| *H05K 3/34* | (2006.01) | |
| *H05K 3/38* | (2006.01) | |
| *H05K 3/40* | (2006.01) | |
| *H05K 7/02* | (2006.01) | |
| *H05K 7/06* | (2006.01) | |
| *H10F 71/10* | (2025.01) | |
| *H10F 77/169* | (2025.01) | |
| *H10F 77/20* | (2025.01) | |
| *H10F 77/30* | (2025.01) | |
| *H05K 1/16* | (2006.01) | |

(52) U.S. Cl.
CPC ........... *H05K 3/3485* (2020.08); *H05K 3/386* (2013.01); *H10F 71/107* (2025.01); *H10F 77/1698* (2025.01); *H10F 77/211* (2025.01); *H10F 77/215* (2025.01); *H10F 77/311* (2025.01); *H05K 1/165* (2013.01); *H05K 2201/0195* (2013.01); *H05K 2201/0338* (2013.01); *H05K 2201/035* (2013.01); *H05K 2201/0391* (2013.01); *H05K 2201/10098* (2013.01); *H05K 2203/0139* (2013.01); *H05K 2203/1105* (2013.01); *H05K 2203/1131* (2013.01); *H05K 2203/1476* (2013.01); *H05K 2203/1545* (2013.01); *Y02E 10/50* (2013.01)

(58) Field of Classification Search
CPC .......... H05K 1/092; H05K 1/117; H05K 3/20; H05K 3/207; H05K 3/323; H05K 3/386; H05K 3/3485; H05K 3/4647; H05K 3/4667; H05K 2201/0195; H05K 2201/0338; H05K 2201/035; H05K 2201/0391; H05K 2201/10098; H05K 2203/0139; H05K 2203/1105; H05K 2203/0113; H01L 21/563; H01L 21/4867; H01L 31/206; H01L 31/2167; H01L 31/022425; H01L 31/022433; H01L 31/03926; B41M 1/12; B41M 5/265; B41M 5/392
USPC ................ 174/260, 254, 257, 264; 361/748; 29/832, 877, 878; 428/32.71, 167, 172, 428/206, 210, 325, 913, 914; 438/108, 438/110, 113, 118, 119, 458, 464, 616
See application file for complete search history.

(56) References Cited

U.S. PATENT DOCUMENTS

| | | | | |
|---|---|---|---|---|
| 5,062,896 A * | 11/1991 | Huang | ..................... | C08K 3/08 252/514 |
| 5,200,762 A * | 4/1993 | Katano | ................. | B41C 1/1041 347/171 |
| 5,215,824 A * | 6/1993 | Munro, III | ............. | B32B 27/08 428/458 |
| 5,609,704 A * | 3/1997 | Hayama | ................. | H05K 3/207 156/289 |
| 5,992,320 A * | 11/1999 | Kosaka | ................... | H01J 9/242 101/401.1 |
| 6,074,893 A * | 6/2000 | Nakata | .................... | H05K 3/207 29/877 |
| 6,207,268 B1 * | 3/2001 | Kosaka | ................. | B41M 5/265 428/206 |
| 6,374,733 B1 * | 4/2002 | Hayama | ................. | H05K 3/207 438/108 |
| 6,709,966 B1 * | 3/2004 | Hisatsune | ............... | H01L 24/13 438/464 |
| 7,923,173 B1 * | 4/2011 | Harris | ...................... | B41C 1/08 430/1 |
| 2001/0013656 A1 * | 8/2001 | Satou | ................... | H01L 23/5283 257/E23.152 |
| 2001/0019177 A1 * | 9/2001 | Sugihara | ................. | G01R 3/00 257/780 |
| 2002/0056509 A1 * | 5/2002 | Miura | .................... | H05K 3/207 156/231 |
| 2002/0094604 A1 * | 7/2002 | Hayama | ............... | H01L 21/4867 257/E21.503 |
| 2003/0008802 A1 * | 1/2003 | Hokkirigawa | ........ | C11D 3/3703 510/506 |
| 2003/0062630 A1 * | 4/2003 | Tanabe | ................. | C08G 59/621 257/E23.04 |
| 2004/0028875 A1 * | 2/2004 | Van Rijn | .......... | B01D 67/00931 264/299 |
| 2004/0142154 A1 * | 7/2004 | Tomekawa | ............... | B32B 15/04 428/209 |
| 2005/0067712 A1 * | 3/2005 | Imaoka | ............. | H01L 23/49833 257/784 |
| 2005/0074592 A1 * | 4/2005 | Hashimoto | ............. | B32B 15/08 428/458 |
| 2005/0118397 A1 * | 6/2005 | Horwitz | .................... | B32B 3/30 428/167 |
| 2005/0205996 A1 * | 9/2005 | Usui | .................... | H01L 23/3128 257/E21.502 |
| 2005/0224254 A1 * | 10/2005 | Endoh | .................... | H05K 1/117 174/257 |
| 2006/0055036 A1 * | 3/2006 | Hashimoto | ........... | H01L 23/544 257/E23.179 |
| 2007/0037321 A1 * | 2/2007 | Higashino | ............... | H01L 24/27 257/E21.705 |
| 2007/0170573 A1 * | 7/2007 | Kuroda | .................. | H01L 23/552 257/E21.705 |
| 2008/0102266 A1 * | 5/2008 | Nakatsuka | ............. | H01G 4/206 264/437 |
| 2008/0262191 A1 * | 10/2008 | Mizori | ................. | C07D 207/40 548/549 |
| 2009/0032992 A1 * | 2/2009 | Fujita | ...................... | B29D 7/01 264/210.1 |
| 2009/0142607 A1 * | 6/2009 | Narui | ..................... | B29C 48/08 428/458 |
| 2010/0178501 A1 * | 7/2010 | Masuko | .................... | C09J 4/06 522/75 |
| 2010/0213169 A1 * | 8/2010 | Hiraoka | ................ | B32B 27/306 216/41 |
| 2010/0258163 A1 * | 10/2010 | Zheng | ................... | H10F 77/707 438/57 |
| 2010/0316421 A1 * | 12/2010 | Komuro | ................ | G03G 15/2025 399/329 |
| 2011/0187009 A1 * | 8/2011 | Masuko | ................... | H01L 24/27 523/435 |
| 2011/0206426 A1 * | 8/2011 | Komuro | ................. | G03G 15/2053 399/329 |
| 2011/0316135 A1 * | 12/2011 | Urushihata | ......... | H01L 23/3107 257/676 |
| 2014/0002370 A1 * | 1/2014 | Konvisser | ............. | G06F 1/1656 174/250 |
| 2014/0321164 A1 * | 10/2014 | Hsu | ...................... | G02B 6/0065 362/629 |
| 2015/0189740 A1 * | 7/2015 | Kido | ........................ | C09D 7/61 174/254 |
| 2015/0202409 A1 * | 7/2015 | Kanemasa | ................ | F16C 1/20 604/95.04 |

(56) References Cited

U.S. PATENT DOCUMENTS

| | | | |
|---|---|---|---|
| 2015/0315781 A1* | 11/2015 | Kang | B29C 59/04 |
| | | | 264/293 |
| 2015/0368402 A1* | 12/2015 | Akinaga | C08G 73/1067 |
| | | | 156/247 |
| 2016/0038729 A1* | 2/2016 | Kato | B29C 41/36 |
| | | | 264/299 |
| 2016/0280969 A1* | 9/2016 | Akutsu | C09J 9/02 |
| 2017/0102804 A1* | 4/2017 | Kikukawa | G06F 3/047 |
| 2017/0285786 A1* | 10/2017 | Hondo | H05K 3/386 |
| 2018/0201005 A1* | 7/2018 | Park | B29C 66/221 |

* cited by examiner

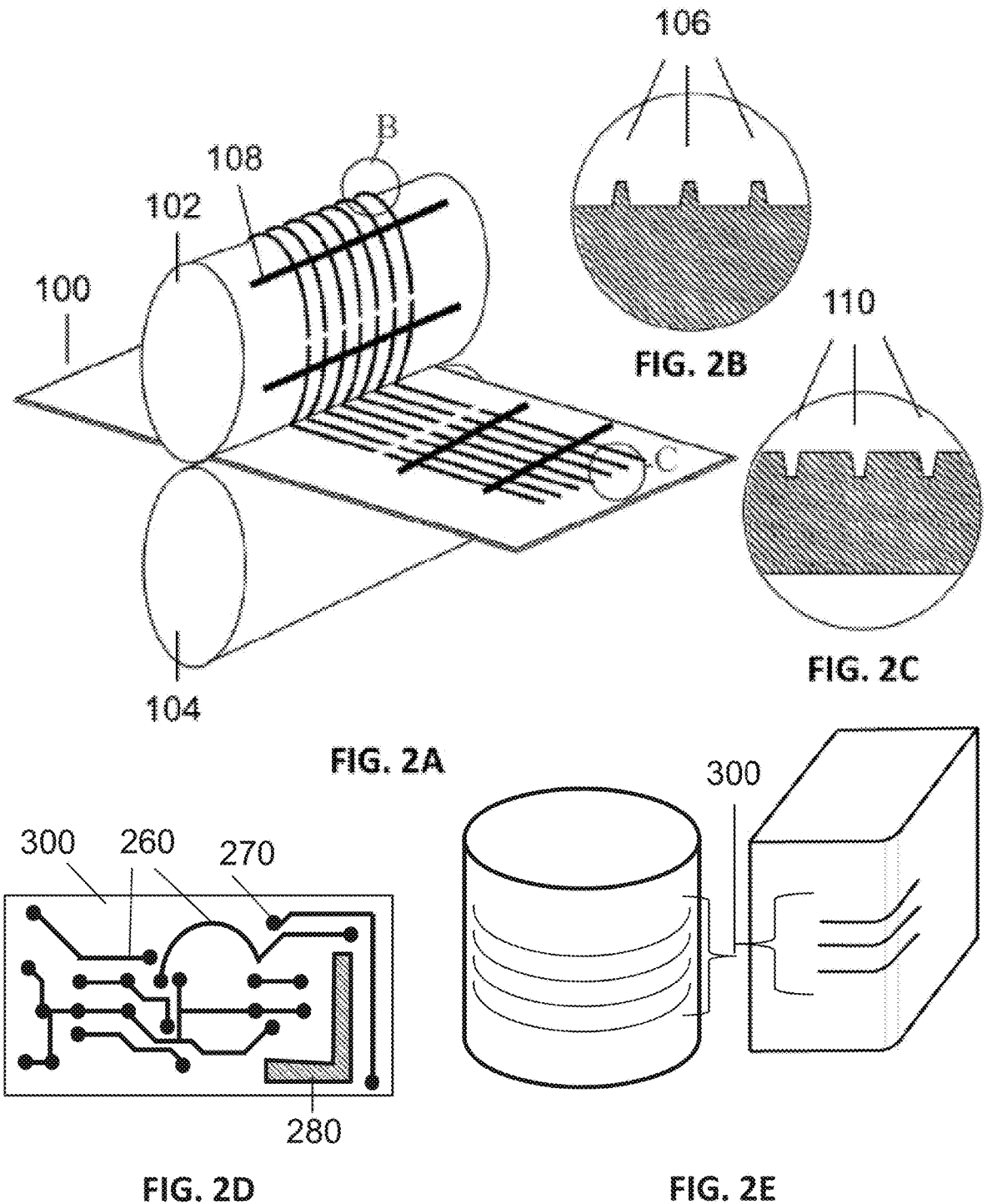

APPLICATION OF ELECTRICAL CONDUCTORS TO AN ELECTRICALLY INSULATING SUBSTRATE

CROSS-REFERENCE TO RELATED APPLICATIONS

This application is a continuation of U.S. patent application Ser. No. 17/132,472, filed on Dec. 23, 2020, which is a continuation of U.S. patent application Ser. No. 16/831,794, filed on Mar. 26, 2020, which is a divisional application of U.S. patent application Ser. No. 16/258,851, filed on Jan. 28, 2019, granted as U.S. Pat. No. 10,645,815, which is a Continuation-In-Part (CIP) of International Application No. PCT/IB2017/054629, filed on Jul. 28, 2017. International Application No. PCT/IB2017/054629 claims priority from Patent Application No. GB1613051.0, filed on Jul. 28, 2016, and from Patent Application No. GB1709427.7, filed on Jun. 14, 2017. This application is related to the patent applications or patents derived from U.S. patent application Ser. No. 16/258,808, filed on Jan. 28, 2019, granted as U.S. Pat. No. 10,973,129, and titled "Application of Electrical Conductors of a Solar Cell" which claims priority from International Application No. PCT/IB2017/054626 and is a CIP application thereof. This application is also related to the patent applications or patents derived from U.S. patent application Ser. No. 17/060,078, filed on Oct. 1, 2020, which is a continuation of U.S. patent application Ser. No. 16/258,892, filed on Jan. 28, 2019, granted as U.S. Pat. No. 10,834,824, and titled "Apparatus for Application of a Conductive Pattern to a Substrate" which claims priority from International Application No. PCT/IB2017/054632 and is a CIP application thereof. The entire disclosures of all of the aforementioned applications are incorporated by reference herein for all purposes as if fully set forth herein.

FIELD

The present invention relates to applying a pattern of electrical conductors to an electrically insulating substrate, as required, by way of example, in the production of printed circuit boards and radio frequency identification (RFID) antennas.

BACKGROUND

Known methods of forming conductors on electrically insulating substrates suffer from several disadvantages, amongst them the limitation that they place on line resolution and exact placement. Often, the techniques are cumbersome, can only be implemented using batch processing and when used to apply conductors to opposite sides of a substrate, each side has to be processed separately.

SUMMARY

With a view to mitigating at least some of the foregoing disadvantages, there is provided in accordance with a first aspect of the present disclosure a method of applying a pattern of electrical conductors to an electrically insulating substrate, which method comprises:

a) providing a flexible membrane, wherein a first surface of the membrane has a pattern of grooves formed therein, the pattern corresponding at least partially to a desired pattern of electrical conductors to be applied to the substrate, b) loading into the grooves of the first surface of the membrane a composition that includes, as composition components, electrically conductive particles and an adhesive, said loading being performed in one or more sub-steps (or filling cycles) such that on completion of the loading step the composition substantially fills the grooves, level with the first surface of the membrane, and parts of the first surface between the grooves are substantially devoid of the composition, c) contacting the membrane with the substrate with the first surface of the membrane facing the substrate, d) applying pressure to the membrane to cause the composition loaded into the grooves in the first surface of the membrane to adhere to the substrate, e) separating the membrane from the substrate to transfer the composition from the grooves in the first surface of the membrane to the substrate, and f) applying sufficient energy to sinter the electrically conductive particles in order to render electrically conductive the pattern of composition transferred to the substrate from the grooves.

In some embodiments, the step of providing the flexible membrane may be divided into two steps: a first step of providing a flexible membrane; and a second step of forming a pattern of grooves in a first surface of the membrane, the pattern corresponding at least partially to a desired pattern of electrical conductors to be applied to the substrate. In some embodiments, the pattern of grooves is formed by advancing a continuous membrane between a die roller and a counter die, the die roller having protruding rules complementary to the pattern of grooves to be formed on the first surface of the membrane.

As further detailed herein, the grooves may have any suitable shape able to form a desired profile on the substrate. Electrical conductors may comprise electrically conductive material, and may include conductive lines (also referred to as traces), contact pads, solder bumps, etc.

The term "electrically insulating substrate" as used herein is intended to include both a substrate made wholly of an electrically insulating material and one having an electrically conductive body but having a surface layer of an electrically insulating material onto which the pattern of electrical conductors is to be applied.

When forming a pattern of conductors, a liquid carrier may be added to the components of the composition to form a wet composition having the consistency of a liquid or a paste. The liquid carrier can consist of an organic solvent or of an aqueous solvent. A wet composition wherein the liquid carrier comprises at least 60 wt. % of water can be termed an aqueous or water-based composition, whereas a wet composition wherein the liquid carrier comprises at least 60 wt. % of organic solvents can be termed a solvent-based composition.

A doctor blade may be used during the step of loading, to press the composition into the grooves and wipe away the composition from the parts of the substrate between the grooves. The relative flexibility and/or hardness of the tip of the squeegee or blade contacting the first surface of the membrane to load the compositions applied thereon within the grooves may be selected and adapted to the consistency/viscosity of the composition being loaded, the dimensions of the grooves to be filled, the force being applied to "wipe" the composition within the pattern and like considerations readily appreciated by the skilled person. The liquid carrier may then be driven off by application of heat or vacuum to leave the dried composition coating the first surface of the flexible membrane or the selected regions therein.

Driving off of the liquid carrier (e.g., the liquid being removed by evaporation) tends to cause shrinkage of the composition remaining in the grooves. It is noted that while the loading step (described as step c) in the afore-mentioned method) may include only a single filling of the grooves, it may optionally comprise a plurality of sub-steps, such as repeated filling sub-steps, with optional sub-steps of liquid removal (e.g., by drying) and cleaning there-between (e.g., by wiping). Such sub-steps may need to be repeated until the dry composition substantially fills the grooves, level with the first surface of the membrane. If the loading step is carried out by repeated cycles of filling, and/or drying, and/or cleaning, the last step would leave the spaces between the grooves on the first surface of the membrane substantially devoid of the composition.

By substantially devoid, it is meant that residual composition in the space in between the grooves, if any, is in an amount/distribution insufficient or too scarce to cause a short circuit between the electrical conductors resulting from the process and/or to significantly affect the properties of the surface of the electrically insulating substrate following transfer. The spaces between the grooves are substantially devoid of composition if 2% of less of their area comprises trace amounts of electrically conductive particles, or less than 1%, or less than 0.5% or less than 0.1%. Such trace amounts of compositions can be detected and estimated by routine image analysis.

When the loading of the grooves is carried out in several steps, which can also be referred to as filling cycles, the relative proportions of the components of the composition may be varied between filling steps. In the first step or steps, the adhesive may only serve to bond the electrically conductive particles to one another but in the last step the adhesive can be relied upon additionally to cause adhesion of the composition to the substrate. For this reason, the proportion of adhesive in the composition may optionally be increased at least in the last filling step or cycle.

Additionally or alternatively, the type of adhesive agent may be modified in between filling steps, the adhesive agent of the last filling step being more potent and/or in higher amount than the adhesive or earlier steps, "potency" relating to the ability to adhere to the substrate. In some embodiments, an adhesive coating may be further applied over the filled grooves of the flexible membrane.

The composition with a lower amount of adhesive (and/or a less potent one, which can then be considered as a binder) and a higher amount of electrically conductive particles may be called the metal paste, whereas the composition with a higher amount of adhesive (and/or a more potent one), appropriate for the adhesion of the dried composition to the substrate, may be called the adhesive paste. The term "paste" is not meant to indicate any particular viscosity, or solid content, however less viscous compositions may understandingly require more evaporation of the carrier. The composition which may be optionally added to cover the filled grooves of the membrane to further facilitate subsequent adhesion to a substrate may be called an adhesive coating.

Alternatively, and additionally, each filling step can be performed with a different type of wiper (e.g., squeegee or doctor blade) each adapted to the composition being loaded within the grooves and/or to the loading conditions.

While a properly applied doctor blade or squeegee may provide the desired result of leaving the non-grooved portions of the membrane's first surface sufficiently clean of the composition, different steps may optionally and/or additionally be taken to achieve such goal, including, by way of example, rubbing, wiping, brushing and the like, in order to remove the composition left on the surface between the grooves, so as to complete the step of loading. Such cleaning may take place between filling sub-stages, or only prior to the completion of the loading step, after the last filling sub-step took place and optionally before the application of an adhesive coating, if applied to the membrane following loading. The optional cleaning is preferably carried out with a cleaning device adapted to the composition to be cleaned and to the membrane.

Any cleaning step, if performed, should not affect the surface of the membrane in a manner that would significantly reduce or prevent subsequent contact with the substrate. It is to be noted that the cleaning sub-step can be performed either before or after the drying of the compositions. If a cleaning sub-step is performed after a drying sub-step, then a cleaning liquid may, if desired, be further applied to the cleaning device and/or to the surface to be cleaned.

For instance, cleaning can be performed by a blade wiper positioned downstream of the filling device (e.g., upstream of a squeegee or doctor blade loading the composition within the grooves). The cleaning blade can have the same orientation as the loading blade with respect to the membrane or can form an opposite angle. The cleaning can alternatively be performed using a cleaning roller having a soft wiping surface. If the cleaning is performed following a drying step, a cleaning liquid can be used to facilitate the displacement of the cleaning device over the surface of the membrane. Such a cleaning liquid, if used, can also facilitate the dislodgment of dry composition residues, if any in the spaces between the grooves. In the afore-provided illustrative examples, the cleaning liquid could be applied downstream of a cleaning blade or serve to impregnate the wiping surface of a cleaning roller. The cleaning liquid is selected so as not to affect the compositions already loaded and/or dried within the pattern of grooves. For instance, the cleaning liquid can be a solvent compatible with the flexible membrane and incompatible with the composition liquid carrier.

The grooves of any desired pattern can be characterized, for instance, by their cross-section profile, by their top view shape, by their dimensions, by their distance from one another and such factors described in more detail below. In some examples, the grooves of the pattern may be substantially identical with one another, whereas in other examples the grooves of a pattern need not be identical, and any first groove may differ from any second groove (e.g., in depth, width, profile of a cross section, and/or delineation). While grooves typically refer to elongated shapes, as used herein the term should not be limited to such a case, and non-elongated shapes, which may be viewed as indentations, are also encompassed by the term grooves. Such non-elongated shapes may be used, for example, for contact pads, solder bumps, etc.

Additionally or alternatively, in some embodiments, an individual groove may also vary along its own length. For instance, from a top view perspective, a segment of a contiguous groove may form a straight delineation and another segment a curved one, or a first segment may have a first width and a second segment a second width and the like variations. From a cross section view, an individual groove may have a first profile in a first segment and a second profile in a second segment and/or a first set of dimensions (e.g., any cross-sectional dimension such as area, depth and/or width) in a first segment and a second set of dimensions in a second segment of the groove. By way of non-limiting example, an individual groove may comprise a first segment having a triangular or trapezoidal profile of a first height/depth and a second segment having a semi-elliptic or semi-circular profile of a different second height/depth. A flexible membrane harboring such non-identical grooves, where an individual groove may consist of relatively shallow trench segments and relatively deeper indentations which may alternate along the length of the groove may serve for the preparation of conductive lines, which are also known colloquially as traces, on a PCB (Printed Circuit Board) or flip-chip interconnect board (sometimes known as an interposer). The deeper indentations form, following transfer, higher spots of conductive material, such as elevated contact pads (e.g., pillars) or solder bumps, which may serve to interconnect adjacent patterns that may be formed in the direction perpendicular to the plane of the substrate or to connect a pattern of electrically conductive lines to an external circuitry (e.g., to a circuit board or another chip or substrate).

In certain aspects of the invention, isolated grooves are created in the membrane to apply 'solder bumps' to pre-existing contact pads on the flip chip or substrate. Notably, the term solder bump is not limited to actual solder, but should be construed as applying to any conducting material applied by the membrane to chip contact pads, for utilizing any flip chip connection principle, such as reflowing, compression, and the like, or any conducting material applied by the membrane to contact pads existing on the substrate.

The membrane in some embodiments is sufficiently flexible at operating temperature (e.g., at ambient room temperature circa 23° C.) to facilitate patterning of the flexible membrane, filling of the grooves with any of the compositions as herein taught, drying of the compositions, or any other required processing, release of the dried compositions from the membrane upon contacting with the substrate, and/or separation of the membrane from the substrate. While in some embodiments, the flexible membrane may be pre-formed and provided as such (e.g., in rolls or sheets), the flexible membrane may alternatively be cast from suitable materials (e.g., thermoplastic polymers that solidify upon cooling or photopolymers that cure upon exposure to radiation which can be referred herein as plastics polymers) to form a membrane as part of the process. Formable plastics polymers that can be embossed or cast are known to the skilled persons.

In alternative embodiments, the embossing of a flexible membrane to generate the desired pattern of groves can be performed at an elevated temperature (e.g., above ambient room temperature). Hot or thermal embossing enables the formation of grooves in membranes made of polymers having a relatively high softening temperature compared to the softening temperature of polymers that are amenable to embossing at ambient temperature ("cold embossing").

Flexible membranes made from such embossable or castable polymers are preferably sufficiently non-elastic to maintain the contour of the grooves (and patterns) to be formed thereupon and the shape of the compositions being filled therein. On the other hand, the membranes are preferably flexible enough to conform to the surface of the substrate, so as to permit a sufficiently intimate contact for transfer of the compositions. The ability of flexible membranes to intimately follow the surface topography of a rigid substrate (e.g., a deliberate texture or a casual roughness or waviness) may additionally allow such transfer to be performed in the absence of an adhesive layer on the membrane and the absence of an adhesive layer on the substrate; or in the absence of an adhesive layer on any significant part of the membrane and the absence of an adhesive layer on any significant part of the substrate.

Yet, in some embodiments a thin layer of adhesive may be applied on the area of the membrane that includes the pattern to be transferred, so as to facilitate the pattern adhesion to the substrate being contacted therewith and/or so as to assist the extraction of the pattern from the membrane. In other embodiments, and for similar reasons, a thin layer of adhesive may be applied on the area of the substrate upon which the pattern is to be transferred from the membrane, while in yet another embodiment a thin layer of adhesive may be applied on both the membrane and the substrate. By "thin layer", with respect to an adhesive that could be optionally applied to one or two of a flexible membrane and a substrate, it is meant a coating having an individual or a combined dried thickness of 2 μm or less, 1.5 μm or less, 1 μm or less, or 0.5 μm or less.

The ability of a flexible membrane to conform to the surface of a substrate, also referred to as the conformability of the membrane, may depend a) on the membrane itself (e.g., its hardness, its crystalline organization (or lack thereof), its viscoelastic properties, etc.); b) on the process used for the contacting the membrane and the substrate (e.g., the pressure and/or the temperature being applied); or c) a combination of both (e.g., when contacting is done at a temperature around the softening temperature of the membrane).

A membrane having a relatively smooth surface can be desired for similar reasons of improving interfacing during the process (e.g., with a squeegee filling the grooves, with the substrate, etc.). Advantageously the mean roughness Rz of the first surface of the flexible membrane is of 1 μm or less, 500 nm or less, 250 nm or less, or 100 nm or less. Other desirable mechanical properties can be readily understood, so as to render the membranes compatible with the method (e.g., stretch resistant, stress resistant, heat resistant, radiation resistant, and the like) and with the compositions used therein (e.g., chemically resistant, chemically inert, etc.)

Flexible membranes with low surface energy can be used in the method disclosed herein, membranes including thermoplastic polymers selected from cyclic olefin copolymer (COC), polypropylene (PP), polyethylene (PE), and thermoplastic polyurethane (TPU) being particularly suitable.

Flexible membranes may be formed of a single layer comprising one or more of suitable plastics polymers, in particular one or more of the afore-mentioned thermoplastic polymers. Alternatively, the flexible membrane can be formed of two or more distinct layers (e.g., each of one or more of the distinct layers comprising one or more of suitable plastic polymers). For instance, by way of non-limiting example, the membrane can comprise a first support layer predominantly providing mechanical integrity and/or strength (e.g., ability to substantially retain its dimensions during the process) of the membrane, a second layer sufficiently deformable so as to permit formation of grooves and a third layer "sealing" the intermediate patternable core of the membrane, improving for instance the adhesion of the membrane to the substrate ahead of transfer of the pattern and subsequent separation of the membrane or any other desirable property which may be preferred for the method according to the present teachings (e.g., providing sufficient toughness to maintain the pattern as desired). All such layers are preferably flexible so as to provide the desired flexibility of the overall membrane formed thereby. In such embodiments, where the membrane is formed from two or more layers, the layer opposite the support layer constitutes the first surface of the membrane due to contact the surface of the substrate during the transfer step.

The transfer of the dried compositions from the flexible membrane to the electrically insulating substrate upon application of pressure (e.g., pressure within a range of about 0.1 kgF/cm² to about 50 kgF/cm², or more specifically within a range of about 7 kgF/cm² to about 10 kgF/cm²) can optionally be conducted at elevated temperatures. Such transfer temperature may depend on the flexible membrane and on the substrate to be so contacted. It may also depend on the compositions loaded within the grooves and how temperature may promote their release from the flexible membrane and/or their adhesion to the substrate. The transfer temperature can be, for instance, of at least 60° C., at least 80° C., at least 100° C. or at least 120° C.; and optionally of at most 200° C., at most 180° C., at most 160° C. or at most 140° C. In some embodiments, the pressure is applied at a transfer temperature in the range of 130-140° C.

In some embodiments, the transfer temperatures are achieved by jointly heating the substrate and the membrane, for instance by contacting them between two rollers, at least one of the cylinders being heated to a temperature allowing their rapid attaining of the desired transfer temperature. In other embodiments, the transfer temperatures are achieved by heating solely the substrate, while the membrane remains or is maintained at ambient temperature. The substrate can be heated by any suitable method, such as by conduction (e.g., passing over a hot plate), by convection (e.g., using a hot air flow), by radiation (e.g., using an IR lamp) or by combination of such heating means.

In some embodiments, the temperature is decreased after pressure is applied to effect proper contact and before the membrane is peeled away to effect transfer of the content of the grooves to the substrate. At this intermediate stage, the membrane is said to be "substrate attached" or the substrate "membrane attached", even though this attachment is temporary until separation takes place. The cooling can be effected by conduction (e.g., passing the substrate attached membrane over a cold surface, serving as a heat sink), by convection (e.g., blowing air optionally cooled towards the substrate attached membrane) or by combination of such cooling means.

The substrate is selected and adapted to the intended use of the pattern transferred thereto, such selection being known to the skilled person. The substrate can be rigid or flexible, made-up of one or more layers of materials. By way of non-limiting example, a substrate suitable for the preparation of a circuit board can be a rigid wafer or a flexible film. The insulating substrate may be made of or only have a surface made of a phenolic resin, a ceramic, an epoxy resin, a glass, a plastics material or any other electrically non-conductive material. By way of example, the substrate of a PCB can be a rigid board of fiberglass (e.g., FR4) or a flexible high-temperature plastic (e.g., a Kapton® polyimide film as available from DuPont Corporation), also referred to as a flex board.

In some embodiments, the insulating substrate can be a substrate of any material having an outer insulating surface formed of a thin layer of electrically insulating material. Such insulating layers, which can have a thickness of a few tens of nanometers up to a few hundreds of micrometers (e.g., in the range of 50 nm to 100 μm) can be applied by any suitable method known to the skilled person, such as spin coating, dip coating or vapor deposition on the substrate body underlayer. By way of non-limiting example, the thin film forming the insulating surface of an electrically insulating substrate can be made of (a) photopolymers derived from B-staged bisbenzocyclobutene (BCB), (e.g., as commercially available from The Dow Chemical Company under the Cyclotene™ 4000 Series), (b) SU-8 epoxy-based negative photoresist, or (c) poly(p-xylylene) polymers (also known as Parylenes). Such insulating thin layers can, for instance, be applied on substrates having an underlying body made of metals or ceramics.

Advantageously, the present method is also highly suitable for substrates that are relatively fragile, and/or relatively brittle (such as glass and ceramics), and/or relatively thin (e.g., having a thickness of 500 μm or less, 400 μm or less, 300 μm or less, or 200 μm or less). Such substrates are particularly sensitive to manufacturing conditions and may readily break under conditions that are acceptable for more robust and/or thicker substrates.

It will be appreciated that the present method, relying on a flexible membrane for the formation of a desired pattern, can be particularly advantageous when the substrate is not planar. Substrates that can be bent, folded and even wrapped around objects, as may be desired to achieve certain applications, can be contacted in one step by a membrane comprising the desired pattern. Furthermore, the present method may be used for non-planar rigid substrates that are not bendable, e.g., cannot be bent, folded or wrapped. For example, assuming an object requiring a board to fold at an angle between a left panel and a right panel of the same board, current being able to flow from one end to the other, present technologies may require the separate preparation of each panel, their assembly and possibly even the need for an intermediate connecting panel or circuitry. Alternatively, if the board is bendable (e.g., is a flexible flex board or made of a material that may be bent, folded or wrapped), in present technologies, the electrical conductors may be formed while the board is still planar. The board may include a flexible polymer which would be underneath the traces, and flexible polymer may be top of at least the traces, so that the traces may bend, fold, etc, appropriately when the board is subsequently bent, folded, etc. In contrast, the present method may be performed while the substrate is non-planar, regardless of whether or not the board is flexible, bendable or rigid. For example, the present method may permit the continuous contacting of the left panel with the corresponding part of the pattern on the flexible membrane and of the right panel with its respective pattern, the intermediate "angle" area between the left and right panels (and corresponding left and right parts of the pattern) providing for an uninterrupted circuitry bridging the two. Advantageously, when the present method is used to apply a pattern of electrical conductors to a non-planar substrate (e.g., being non-bendable), it is not necessary (though permitted) to use a flexible polymer underneath the conductors. In other words, in some embodiments, there is no polymer between the electrical conductors (e.g., conductive lines) and the insulating substrate. While conventional techniques may require the electrical conductors to be entirely surrounded by a wrapping polymer, this is not necessary (though permitted) for electrical conductors (e.g., conductive lines) applied by the present method. Hence, in some embodiments an electrically insulating substrate prepared by the present methods may be characterized by the absence of a flexible polymer between at least part of the electrical conductors and the substrate, and optionally further characterized by the absence of a wrapping polymer surrounding at least part of the electrical conductors.

The present invention may additionally or alternatively be particularly advantageous for forming a pattern of electrical conductors corresponding to a desired circuitry on a large area of a substrate. Due to the usage of a flexible membrane, and the availability of membranes having relatively large dimensions or the ability to cast such membranes, the entire pattern of grooves corresponding to the desired circuitry may be formed in a continuous manner over the entire surface of the membrane corresponding to the area of the substrate on which the pattern shall be transferred. In contrast, present technologies, such as photolithography, may be performed consecutively on a plurality of limited areas of the substrates (e.g., where the size of each area may be limited by the field of view of the lithographic equipment, such as at most 70 cm×70 cm), forming parts of the circuitry which would then need to be stitched together to form the desired circuitry.

Further steps may depend on the intended use of the metal pattern.

In embodiments wherein the substrate has a vitreous surface, the composition may include a glass frit, and concomitantly with, or and subsequent to the composition being sintered by heating to render it electrically conductive, the substrate and the composition may be fired to cause the conductors to fuse, or otherwise adhere, with the substrate.

In a further aspect, set forth in the appended claims, the invention provides insulating substrates harboring such conductive patterns produced by methods of the invention. Such membranes and patterned insulating substrates can be characterized by various features, illustrated herein in more details in connection with the diverse embodiments of the method, as herein taught.

In one such further aspect, there is provided an electrically insulating substrate having an electrically conductive pattern comprising a pattern of electrical conductors applied on a first side of the substrate, wherein at least part of the electrical conductors fulfils one or more of the following features:
  (a) a distance between facing edges of adjacent electrical conductors is at least 7.5 µm and is less than 12.5 µm;
  (b) the at least part of the electrical conductors consists of sintered electrically conductive particles and of voids between said sintered particles, the voids being present in at least 1% by area in a cross-section of the electrical conductors; and
  (c) the at least part of the electrical conductors includes at least one contact pad that is flat on the first side of the substrate, the at least one contact pad being capped by a solder bump, and wherein the at least one of the solder bumps capping the at least one of the contact pads have a diameter of at most 50 µm.

In one such additional further aspect, there is provided an electrically insulating substrate, wherein a pattern of electrical conductors is applied to the substrate by a method comprising:
  a) providing a flexible membrane, wherein a first surface of the membrane has a pattern of grooves formed therein, the pattern corresponding at least partially to a desired pattern of electrical conductors to be applied to the substrate;
  b) loading into the grooves of the first surface of the membrane a composition that includes, as composition components, electrically conductive particles and an adhesive, said loading being performed in one or more filling cycle(s) such that on completion of loading the composition substantially fills the grooves, level with the first surface of the membrane, and parts of the first surface between the grooves are substantially devoid of the composition;
  c) contacting the membrane with the substrate, with the first surface of the membrane facing the substrate;
  d) applying pressure to the membrane to cause the composition loaded into the grooves in the first surface of the membrane to adhere to the substrate;
  e) separating the membrane from the substrate to transfer the composition from the grooves in the first surface of the membrane to the substrate; and
  f) applying sufficient energy to sinter the electrically conductive particles and to render electrically conductive the pattern of composition transferred to the substrate from the grooves.

BRIEF DESCRIPTION OF THE DRAWINGS

Implementation of the present disclosure will now be described further, by way of example, with reference to the accompanying drawings, in which:

FIG. 2A is a perspective view of the process step shown in FIG. 1A providing an example of how a line pattern may be designed to form a continuous membrane having discrete spaced patterns, each intended for application to a separate respective substrate, and each pattern defining a set of parallel conductors connected to one another by transverse backbone current collectors;

FIGS. 2B and 2C are respectively enlarged views of the circles designated B and C in FIG. 2A showing the grooves in cross section;

FIG. 2D schematically illustrates a pattern of electrical conductors which can be manufactured according to various embodiments of the present method;

FIG. 2E shows how patterns of electrical conductors prepared according to the present teachings can, in some embodiments, be applied to non-planar substrates;

DETAILED DESCRIPTION

The ensuing description, together with the figures, makes apparent to a person having ordinary skill in the pertinent art how the teachings of the disclosure may be practiced, by way of non-limiting examples. The figures are for the purpose of illustrative discussion and no attempt is made to show structural details of an embodiment in more detail than is necessary for a fundamental understanding of the disclosure. For the sake of clarity and simplicity, some objects depicted in the figures may not be drawn to scale.

For brevity and clarity, the description is generally directed to forming a pattern as shown in FIG. 2A (enlarged views of which are shown in FIGS. 2B and 2C), by way of illustrative example only. The skilled in the art would readily understand that the pattern formed by grooves, and ensuing corresponding conductors pattern may take any form, and is a matter of technical choice dictated by the matter at hand.

FIG. 2D schematically illustrates an alternative exemplary pattern 300 of electrical conductors, the pattern being formed by a number of traces 260 of various shapes and lengths and including, where desired, contact pads 270. The L-shaped element 280 represents a second pattern of a second material that may optionally be inserted together or within conductive pattern 300, as shall be detailed hereinbelow. In some embodiments, patterns such as illustrated by way of example by 300 in the present figure, can be apposed to non-planar electrically insulating substrates, as schematically depicted in FIG. 2E. In this figure, the parallel lines on part of the curved surface of the cylinder or of the bent surface of the parallelepiped are depicting in a simplified manner a pattern of conductive lines on such non-planar substrates.

Flexible Membrane Patterning

Figure 1A:
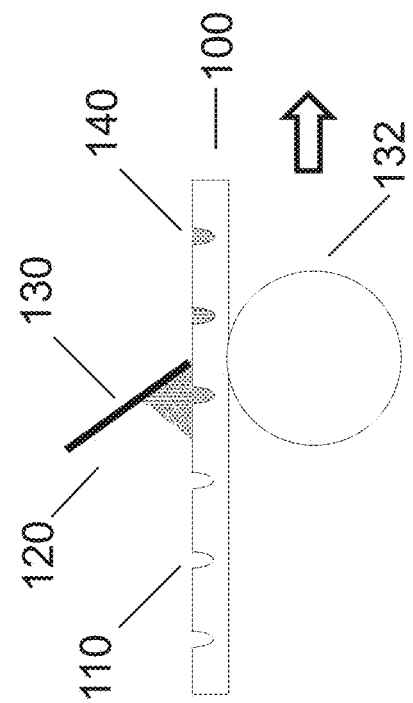
FIGS. 1A to 1D are sections showing simplified process steps in forming a pattern of grooves and lines of a composition containing electrically conductive particles on a membrane and then transferring the pattern to a substrate.

In FIG. 1A, there is shown a membrane 100, made of a plastics material, that is passed through a nip between a cylindrical pressure roller 104 (which may also be referred to as a counter die) and a die roller 102. The die roller 102 can be formed of a cylinder from the smooth surface of which there project rules 106 and 108. The manner in which the die roller 102 is formed is not of fundamental importance. One method of its manufacture may be by etching a smooth cylinder and an alternative would be to mount an embossing shim (typically made of nickel or chrome) with protruding rules 106 and 108 around a cylinder. While not shown in the figure, the flexible membrane 100 can be formed of one or more layers of distinct flexible materials.

Rules 106 are parallel to the circumference of die roller 102 and are aligned with each other along the axis of the die roller so as to form upon contacting the facing surface of the membrane, grooves parallel to the direction of movement of the membrane. Only one such rule can be seen in the schematic cross-section of FIG. 1A. Rules 106 need not follow the entire circumference of the die roller, their length being adjusted to the desired length of the longitudinal lines in the grooves pattern. Rules 108 are parallel to the axis of die roller 102 and can form upon contacting the facing surface of the membrane 100, grooves transverse to the direction of movement of the membrane, and optionally orthogonal to the longitudinal grooves formed by rules 106. Rules 108 need not extend along the entire length of the die roller, or width of the membrane, their length being adjusted to any desired number of longitudinal lines to be traversed in the grooves pattern. The lengths of rules 106 and 108 may also take into account the dimension of the intended substrate and margins that may be required to surround any particular pattern. Though rules 106 and 108 are illustrated as straight lines, it is readily understood that a die roller 102 may carry rules forming any other desired shape.

The edges or profile of the rules can have any desired shape, typically regular, allowing for the transfer of the composition from the membrane to a substrate, and therefore have desirably a tapering form. Such a profile is schematically illustrated by a semi-ellipse in FIGS. 1A-1D. The edges of rules 106 can be, by way of example, trapezoidal, that is to say that the rules may have upwardly tapering sides and a flat top. The width of the base of the trapeze is herein denoted $W_B$, the width of the flat top wr, and the height between the two, h, as will be discussed in more details with reference to FIG. 5A. Rules 108 may have edges similarly shaped to those of rules 106, but this need not necessarily be the case. For example, rules 108 may be formed from an assembly of protrusions rather than from a single shape, as previously exemplified by a trapeze for rules 106. Rules 108 can for instance be formed by a strip of mesh material. In some embodiment, wherein rules 108 may serve for the later formation of backbone current collectors, the width of the mesh stripe can be larger than the width of the base of rules 106. While in the depicted example, the number of rules 108 is smaller than the number of rules 106, this should not be limiting, as the number of rules of each type and their respective dimensions and positions on the patterning device depends on the metal patterns desired to be applied on the electrically insulating substrate. Similarly, while for simplicity rules 106 and 108 are illustrated as being perpendicular, they can form any desired angle with one another, as illustrated in an exemplary resulting pattern 300 shown in FIG. 2D.

Though in the following, the terminology assigned to trapezoidal cross sections shall be used, rules may have any different tapering shape satisfying similar ranges. The top edge of a rule may come to a point if the rule cross section is a triangle, a semi-circle or a semi-ellipse, and the like. The width of the base of the rules may depend on its function. Widths of up to a few millimeters can be suitable for backbone current collectors (referred to as bus bars in some fields of application), and even wider rules may be suitable for certain electrodes (e.g., ground electrodes), if such are prepared using a grooved membrane. In some embodiments, for longitudinal lines, base widths of 50 micrometers (μm) or less may be preferred, a $W_B$ in the range of 10-40 μm, or 10-30 μm, or 10-20 μm, or even 5-20 μm, being particularly desired. The width of the top of the rule can also depend on function, and be approximately commensurate with the base width, though typically smaller. In some embodiments, for longitudinal lines, top width of 40 μm or less may be preferred, a $w_T$ in the range of 5-25 μm, or 5-15 μm, or 10-20 μm, being particularly desired. In some embodiments, the height of the rules h may not exceed 50 μm, a h in the range of 25-40 μm, or 25-30 μm, or 15-25 μm, being particularly desired. It can be appreciated from the above numerical examples that in some embodiments, the aspect ratio (ASP) between the height h of a rule 106 and its base width $W_B$ can be within a range of about 5:1 to about 1:5, of about 5:1 to about 0.7:1, of about 3:1 to about 1:1, of about 2:1 to about 1:2, of about 1.75:1 to about 1:1.75, or of about 1.5:1 to about 1:1.5; optionally the ASP of about 2:1, about 1.5:1 or at least 1:1, being preferred.

Additionally, the pattern can be characterized by the distance d between the facing edges of adjacent grooves (e.g., the space between the right edge of a groove on the left side of a pair of adjacent grooves and the left edge of the groove on the right side of the pair). Typically, such distance between facing edges is no less than 7.5 µm, no less than 10 µm, or no less than 12.5 µm, and thus the distance between the electrical conductors formed on the substrate from the composition in adjacent groves may be no less than 7.5 µm, no less than 10 µm, or no less than 12.5 µm. Such a low minimum distance may be advantageous compared to conventional methods (e.g., conventional removal of portions of a copper conductive layer) where the distance between electrical conductors generally is of 15 µm or more. For example, the distance between the facing edges of adjacent grooves/or adjacent electrical conductors once transferred according to the present teachings may be within a range of at least 7.5 µm and at most 12.5 µm or at most 15 µm. For longitudinal lines, the maximal distance between two grooves may depend on the intended use and/or the desired efficiency. For instance, for the preparation of certain circuit boards d is at most 2,000 µm, at most 1,500 µm, at most 1,000 µm, or at most 500 µm. It is to be noted that the dimension of the grooves and of the lines resulting from any particular rules, are not necessarily identical to the dimension of the original rule. Such variations may depend on the membrane being used and on other variables of the process. Advantageously, such variations do not exceed 25% of the original dimensions.

Yet, the present method allows transferring to the substrate metal lines having a relatively high aspect ratio, generally supporting lower resistance. Taking for illustration, a metal trace having a width of 25 µm, clearly a line having a height of 50 µm, namely an ASP of 2:1, would have lower resistance than a line having a height of only 5 µm, namely an ASP of 1:5, all other parameters (e.g., metal line composition) being similar.

The die roller 102, though typically significantly more intricate and/or with rules having smaller dimensions, may be formed in the same way as used in producing dies for creasing or cutting cardboard. As the membrane 100, passes through the nip between the pressure roller 104 and the die roller 102, grooves or indentations 110 are formed in the upper surface of the membrane. The nip between the die roller and the counter can also be referred to as the patterning nip. The rules 106 and 108 are designed to form a groove pattern in the membrane that corresponds to the pattern of the electrical conductors to be applied to a substrate, which may be an insulator or a semiconductor. Though in the present figure, and as shown more clearly in FIG. 2A, two sets of rules are illustrated for the formation of a depicted groove pattern in the membrane, this is not limiting, as different applications may require only one set or more than two sets of rules, as relevant to the desired patterns.

The patterning element is illustrated as a rotating die roller 102 forming a patterning nip with a respective counter die (e.g., cylinder 104), the pattern being formed as the membrane moves through the nip (e.g., the membrane and the patterning element being in relative motion during the patterning). However, alternatively shaped assemblies of rules may be suitable to form grooves as above described. The formation of grooves in the membrane can be, for instance, achieved by plates. If the process is carried by passing the membrane through fixed stations, such a groove forming station and a groove filling station to load the compositions, lengths of slack membrane between the stations can permit the process to be performed continuously. As sub-steps of the loading step may be repeated, there might be more than one filling station wherein the compositions may be applied and dried, each station can be operated under different conditions, in particular when the compositions being loaded within the grooves differ from one repeat to another.

In addition to embossing the pattern of grooves within a preformed flexible membrane of one or more layers, the membrane can be cast from a relatively viscous yet fluid state material, the grooves being formed prior to the hardening of the film. The pre-hardened material can be referred to as "pre-membrane" material. For instance, the membrane can be formed by extrusion of pre-membrane material through a nozzle having on at least part of its contour protrusions able to yield the corresponding grooves in the film as it hardens. Similarly to the process described in FIG. 1, a fluid of pre-membrane material can be cast through a smooth slot and the grooves formed by a rotating die roller or by plates carrying the desired pattern of rules. Depending on the materials being used, the hardening of the relatively fluid pre-membrane material into a flexible membrane with a pattern of grooves according to the present teachings can be achieved by cooling the film and/or by curing it. Such processes of cold/hot embossing and UV-embossing are known and need not be further detailed herein.

The pre-membrane material can for instance be a UV-curable material, which can be cast, by way of example between a rotating die roller and a transparent counter surface (e.g., pressure roller) allowing to UV-cure the film as it passes at the nip where the grooves or indentations are being formed. The pre-membrane polymer or blend thereof can be cast as a single self-supporting layer or can be cast to form a patternable layer (e.g., made of CPP) upon a relatively less deformable support layer (e.g., a PET film).

Optionally, the grooves may be formed by a directed laser beam. In such embodiments a laser beam is directed at desired locations of the membrane, to ablate portions of the membrane, or to heat it causing shrinkage. Furthermore, the grooves may be formed by one or more punches applying pressure to the membrane.

Figure 1B:
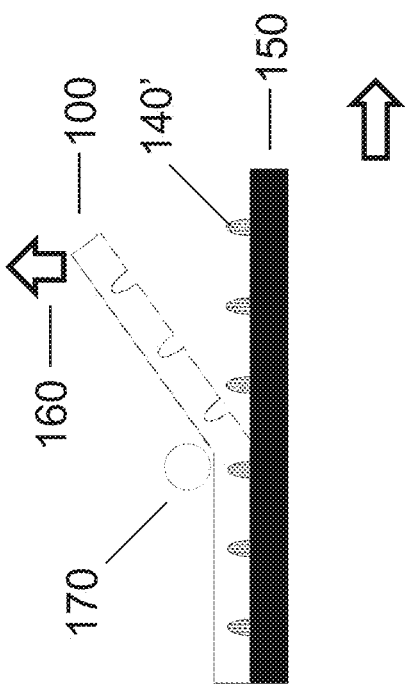
Figure 1C:
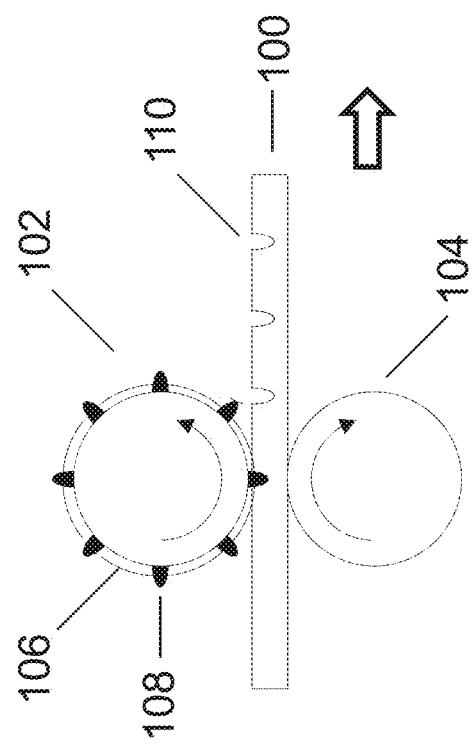
Figure 1D:
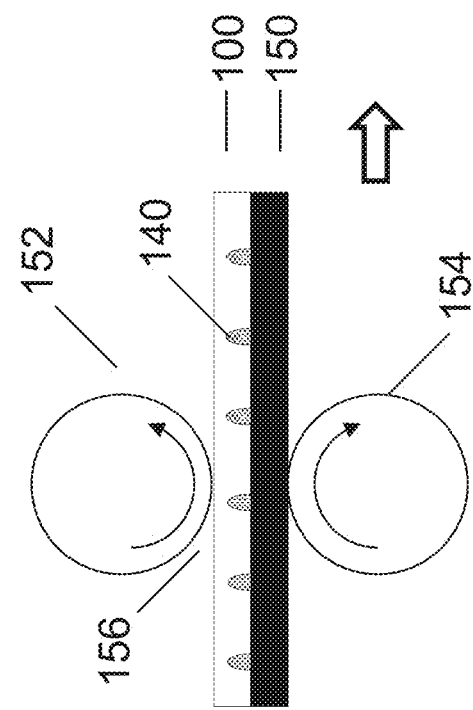
Figure 1E:
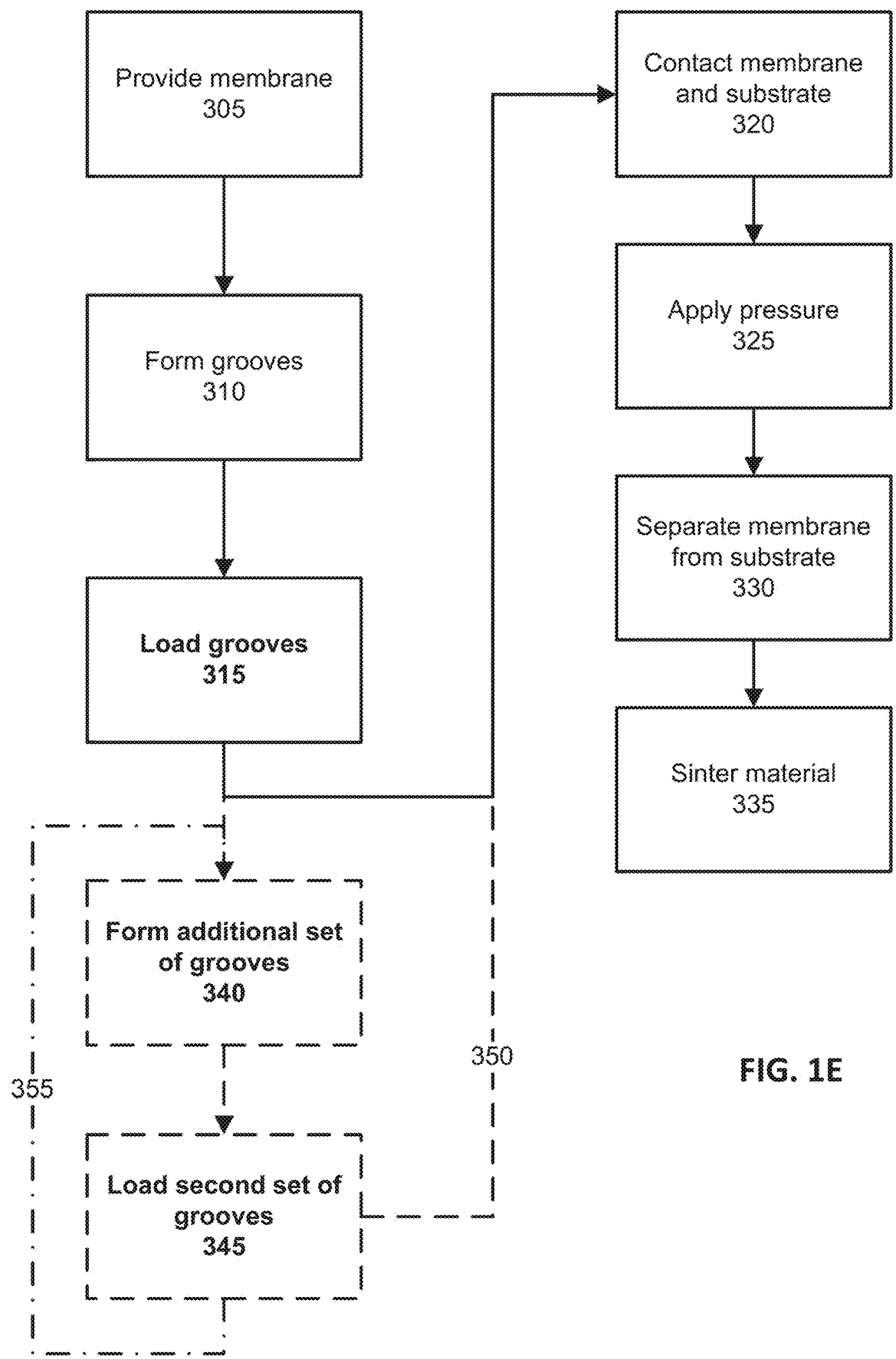
FIG. 1E depicts a simplified diagram of a process to implement the process of FIGS. 1A to 1D.

FIG. 1E is a simplified flow diagram depicting process steps in applying a pattern of electrical conductors to an electrically insulating substrate, which may in turn form a PCB or a RFID. The process begins by providing a suitable flexible membrane 305 and forming a pattern of grooves 310 in a first surface of the membrane, the pattern corresponding at least partially to the desired pattern of electrical conductors to be applied to the substrate. The grooves are then loaded 315 with a composition that includes electrically conductive particles and an adhesive. The loading step, which includes filling the grooves with the desired composition then optionally drying it and/or cleaning the space in-between the grooves, can be repeated until the dried composition essentially levels with the surface of the membrane. Alternatively, a subset of the grooves (partially relating to the desired pattern to be applied to the substrate) may be formed and loaded, and the forming and loading may then be repeated for one or more other subsets of grooves (also partially relating to the desired pattern). After the loading step has been completed for all the grooves, the membrane is contacted 320 with the substrate and pressure is applied 325 between the membrane and the substrate, to cause the composition loaded into the grooves in the first surface of the membrane to adhere to the substrate. The membrane is then separated 330 from the substrate to transfer at least some, and preferably substantially all, of the composition from the grooves in the first surface of the membrane to the substrate, and sufficient heat or other form of energy is applied to sinter or otherwise fuse 335 the electrically conductive particles in order to render electrically conductive the pattern of composition transferred to the substrate from the grooves.

The loading step, which includes filling the grooves with the desired composition(s), may also include substantially drying or otherwise stabilizing the composition(s). Such steps can be repeated until the sufficiently dried composition is essentially level with the surface of the membrane. The loading step may also include one or more cleaning steps, which may be performed simultaneously with, or separately from, the one or more filling steps by the likes of a doctor blade, a squeegee, a wiper, and the like. Alternatively or additionally, the first surface of the membrane may be wiped brushed, or otherwise cleaned.

From the perspective view of FIG. 2A, it may be seen that the membrane may be a continuous membrane on which the same groove pattern is applied repeatedly. The pattern may comprise parallel lines extending parallel to the length of the membrane, these longitudinal lines being formed by circumferential rules 106 on the die roller 102, as well as transverse backbone current collectors, which are formed by rules 108 extending axially on the surface of the roller 102. An enlarged cross-section view of a few exemplary rules 106 is shown in FIG. 2B. Helical rules (not shown) on the die roller 102 may be used to form diagonally extending grooves, likewise relatively curved connecting rules may serve to join the linear ones so far described, thereby enabling any desired pattern of conductors to be formed. Though for simplicity of illustration, the rules 106 or 108 are shown has having same length among their group, this need not be the case (see 520 and 530 in FIG. 5A by way of example).

The Flexible Membrane

As explained, it is required of the membrane that it should not have the resilience to return to its original shape after passing through the nip, beneath plates, or after the grooves are being formed in any desired manner. The membrane may suitably be formed of one or more plastics polymers, in particular thermoplastic polymer(s) selected from the group comprising cyclic olefin copolymer (COC), ethylene-vinyl acetate (EVA), polyamide (PA), polycarbonate (PC), polyethylene (PE), polyethylene terephthalate (PET), polypropylene (PP), polyurethane (TPU), polyvinyl chloride (PVC), and substituted versions thereof. But it may alternatively be formed of different polymers, or of non-plastics materials, such as photopolymers, that can be hardened after grooves have been pressed into any of them. It is desirable for the membrane to be sufficiently flexible to permit it to be coiled. It is also important that the membrane be sufficiently flexible to be peeled away (or in other words stripped off) from the surface of the substrate.

It should be stressed that the above described method of forming a membrane having a groove pattern is not fundamental to the invention. Any membrane formed by extrusion, stamping or machining may be used, so long as it is pliable, and preferably flexible, and is capable of maintaining accurate grooves of the desired depth, width and cross section (e.g., a trapezoidal or triangular cross section), the grooves being shaped and spaced as desired within the pattern.

The membrane can be supplied in sheets or as a continuous web. The dimensions of the membrane are not limiting, but need preferably be commensurate with the patterning element and the intended substrate. For instance, the width of a membrane may approximately correspond to the length of die roller 102 in its axial direction, while the length of the membrane, if provided as individual sheets, the length being parallel to the direction of movement, is typically a low multiple of the roller circumference. The thickness of the membrane exceeds the height of the rules (i.e., the depth of the grooves) and is generally in the range of 20-100 μm. If the membrane if formed by more than one layer of polymers, its thickness can be in the range of 20-150 μm, each layer being individually in the range of 0.5-100 μm. For instance, a support layer (e.g., made of PET) can have a thickness of 8-75 μm, a patternable/deformable layer (e.g., made of CPP) can have a thickness of 10-75 μm, and a protective sealing layer optionally furthering future proper contact with the substrate (e.g., made of ethylene vinyl acetate copolymer resins, such as commercialized as Elvax®) can have a thickness of 0.5-5 μm.

It is noted that patterns generated by one cycle of the die roller may suffice to the preparation of a plurality of end-products, even if the lamination contact of the membrane to the desired substrate is performed in parallel and/or in series on an area corresponding to a number of such end-products.

If desired, the surface properties of the flexible membrane may be modified (e.g., by physical or chemical treatment) to improve the suitability of the membrane for application of any following material. For instance, if the flexible membrane is made of a hydrophobic polymer and the compositions to be subsequently applied may not sufficiently wet it or otherwise interact therewith, then a modification of the polymer surface, or part of it such as a selective modification of the grooves wall surface, may be performed. The surface can be treated (e.g., corona treatment or chemical treatment with wetting improving agents) in order to improve the wettability of the flexible membrane or of its grooves, so that it becomes relatively more hydrophilic. The compositions may also include agents improving their wetting of the membrane. The membrane, or part thereof, and the interfacing compositions are sufficiently wettable or wetting, accordingly, if their contact is intimate enough to prevent undesired entrapment of air bubbles of a size and/or in an amount and/or at a density which may weaken the resulting pattern. Preferably, optimal wetting of the flexible membrane by any composition interfacing therewith result in a subsequently dried layer of the composition being substantially continuous and/or devoid of air bubbles.

Regardless of the method of forming the flexible membrane and patterning it, or of any facilitating modification applied thereto, the membrane is typically characterized by its ability to conform the surface of a substrate to be thereafter contacted. While the intimate contact of the membrane with the substrate surface may bring about the deformation of the membrane surface in accordance with any texture, waviness or roughness of the substrate, such "replication" of the substrate surface does not negatively affect the transferability of the pattern from the membrane. On the contrary, the high conformability of the membrane to the surface of the substrate is believed to increase the contact area between the two, facilitating transfer there-between. It should be noted that, as opposed to conventional methods, an irreversible alteration of the membrane, if any, during transfer of a composition pattern may be of no consequence, in embodiments where the flexible membrane is disposable and can therefore be thrown away following transfer and peeling. It should be further noted that although deformation of the flexible membrane may mirror the topography of the surface of the substrate, (e.g., in the sub-millimeter or sub-micron scale), the variations in topography on the surface of the substrate may be smoothed out to a certain extent in the deformed membrane. For example, peaks on the surface of the substrate may be halved in magnitude in the deformed membrane.

Compositions for the Patterns of Electrical Conductors

After the groove pattern has been formed in the membrane 100, the next step in the process is to fill the grooves with a composition that contains electrically conductive particles, for instance silver, and an adhesive, such as a hot melt polyamide (if transfer is performed at elevated temperature). This loading step is shown in FIG. 1B where the membrane 100 passes between a pressure roller 132 and a blade or scraper 130 that squeezes the composition 120 into the grooves 110 to fill grooves in the manner shown to the right of the blade 130 in FIG. 1B, a filled groove being shown as 140. An enlarged cross-section view of exemplary grooves 110 before their loading is shown in FIG. 2C.

In the following, the proportion between various compounds or agents forming a composition can be provided in weight per weight (w/w) or volume per volume (v/v) ratio, or percentage of the composition, part thereof, or even with respect to a single other constituent, which percentage can be denoted wt. % and vol. %, respectively.

The particles (whether of metal or of adhesive, such as glass frits) may have any shape, for instance form regular or irregular spherical beads/flakes/rods and the like, preferably the individual particles of metals are devoid of cavities that may prevent proper sintering or firing at a later stage. The maximum dimension of the particles should be smaller than the groove minimal size in any of its axis/dimension. (e.g., the particles are in the order of a few microns, commonly not exceeding 10-20 µm, and often significantly smaller, such as in the nanometer scale). Too large particles may not pack satisfactorily within the groove, depending on their shape, such deficient packing reducing or preventing the formation of adequately conductive conductors. Though smaller particles are easier to pack in the groove, excessively small particles may not be beneficial. First, they may undergo uncontrolled sintering at temperatures relatively lower than the sintering temperature of larger particles (e.g., at transfer temperature of about 135° C.). Such premature sintering of particles that are too small may subsequently affect transfer of the paste (hampering flow) and its interfacing with the substrate. Second, the increased surface area of numerous small particles may require the presence of additional adhesive, which may in turn affect the rheology of the composition and the workability of the paste. Furthermore, the increased presence of adhesive may interfere with sintering (affecting prospective conductivity). Hence particles having a maximum dimension of at least 200 nm; and optionally at most 10 µm, are preferred. In some embodiments, the electrically conductive particles have a maximum dimension in the range of 0.5-5 µm or 1-3 µm. Populations of particles heterogeneous in size, though not essential for certain shapes, may improve the packing within the grooves, resulting in packing having less inter-particular voids. Such packing facilitates sintering and if needed firing, and can improve the conductivity of the finished sintered/fired conductor.

Information about particle size is generally provided by the suppliers, and may be determined by routine experimentation using, Dynamic Light Scattering (DLS) techniques by way of example, where the particles are approximated to spheres of equivalent scattering response and the size expressed as hydrodynamic diameter. Dimensions of particles may also be estimated by microscopic methods and analysis of images captured by scanning electron microscope (SEM), transmission electron microscope (TEM), focused ion beam (FIB), and/or by confocal laser scanning microscopy techniques. Such methods are known to the skilled persons and need not be further detailed. As particles typically have different sizes in different directions, unless perfect spheres, the longest dimension in the largest plane projecting from the particle is considered for simplicity. When the particles are globular or near spherical, the "longest dimension" is approximately their diameter which can be estimated by DLS methodology. In such a case, the hydrodynamic diameter of 90% of the population of the particles, but more typically of 50% of the population, can serve to assess the size of the particles. In other words, and depending on shape, the particles can be characterized by their longest length L, by their thickness, by their hydrodynamic diameters at $D_V 90$, $D_V 50$, $D_N 90$ or $D_N 50$.

As used herein, the term "electrically conductive particles" encompasses particles made of any conductive material, including metals, metal oxides, metal salts, organo metals, alloys and conductive polymers, as well as any electrochemically compatible combinations of the foregoing (e.g., a mixture of two metals, aluminum and silver). By electrochemically compatible, it is meant that any conductive material of any layer is chemically inert with respect to any other conductive material of the same layer, or of other layers when the loading of the grooves is done by repeated filling sub-steps. In particular none of the materials are deleterious to the intended effect, more specifically not affecting the electrical conductance and/or conductivity of the ultimate conductors that can be obtained by the present method, nor their ability to properly attach to the substrate in due time.

Metals can be selected from the group comprising aluminum, copper, gold, silver, tin, nickel, platinum, zinc; and alloys can be selected from the group comprising bronze, brass and palladium/silver. Organo-metals can be selected from the group comprising copper (II) formate ($C_2H_2CuO_4$), copper (II) hexanoate ($C_{12}H_{22}CuO_4$), copper (I) mesitylene ($C_9H_{11}Cu$), vinyltrimethylsilane Cu(I) hexafluoro-acetylacetonate, silver neodecanoate ($C_{10}H_{19}AgO_2$), precursors, hydrates and/or salts thereof.

In addition to electrically conductive particles, the composition 120 includes an adhesive. Different types or amounts of adhesives may be used depending on the elected method step and the ultimate substrate. Broadly, the adhesive may be one or more of a) an organic binder sufficient to maintain the cohesivity of the electrically conductive particles but insufficient to provide enough adhesion to the substrate (a "poor adhesive"), b) an organic adhesive additionally adequate to provide the desired adhesion to the substrates (a "potent adhesive"), and c) glass frits, which may be deemed an inorganic adhesive, when the method is used at elevated temperatures into glass and/or glass-receptive substrate, such as for insulating substrates having a vitreous surface. In the event a first composition lacks a potent organic adhesive of type (b), then a second composition enriched with a suitable adhesive is consequentially used, as will be described in more details with reference to FIG. 3.

Adhesive compounds (e.g., organic adhesives) can be, for instance, pressure sensitive adhesives, if transfer is performed only under pressure, or heat sensitive adhesives (e.g., hot melt adhesives), if transfer conditions further include elevated temperatures. The hot melt adhesives can be polymers having a softening point in the range of relevance to transfer, for instance between 60° C. and 180°

C. A softening temperature in such range can optionally be achieved by mixing an adhesive agent having a relatively higher softening point with a plasticizer able to reduce such phase transition temperature. Softening temperatures of polymers are provided by their suppliers, but can be assessed by routine experimentation according to methods known to the skilled persons, for instance by using Differential Scanning calorimetry (DSC).

The adhesive is compatible with other components of the composition (e.g., the electrically conductive particles, the glass frits, when present, and the carrier) and the process conditions, for instance, providing for a suitable flowability of the composition within the grooves and/or excess removal from membrane surface, being non-brittle to maintain pattern integrity or being sufficiently "heat resistant" till sintering of electrically conductive particles to remain in an amount maintaining adequate shape. The adhesive should preferably have a relatively low adhesion to the flexible membrane (e.g., only sufficient for the composition, wet or dry, to remain within the grooves during manufacturing and handling, but to be releasable from the membrane when it is peeled off from the substrate after lamination). On the other hand, the adhesive should preferably have a relatively high adhesion to the receiving substrate (e.g., allowing for the transfer of the metal pattern to the substrate). Advantageously, adhesives having a low ash content are expected to facilitate metal sintering, improving conductivity (optionally after firing). Adhesives having an open time sufficiently long to allow proper transfer of metal pattern to the substrate, following its optional heating to an elevated transfer temperature, while being sufficiently short to maintain the desired shape (structural integrity of the pattern) following transfer, are considered suitable. It is to be noted that open times of less than a few seconds, one second, hundreds or even tens of a millisecond are preferred.

Exemplary organic adhesives can be polyamides, including, for instance, commercially available hot melt polyamide adhesives Uni-Rez® 147, Uni-Rez® 2620 and Uni-Rez® 2720 (formerly of Arizona Chemical, now of Kraton Corporation, USA), Macromelt® 6211, Macromelt® 6238, Macromelt® 6239, and Macromelt® 6264 (Henkel, Germany), Versamid® 744 and Versamid® 754 (Gabriel Performance Products, USA); terpene phenolic resins, such as Sylvaprint® 3523 and Sylvaprint® 7002 (Arizona Chemical, USA); hydrogenated Rosin, such as Foral™ AX-E (Eastman Chemical Company, USA); ethylene-vinyl acetate (EVA) copolymers, including, for instance, commercially available Elvax® 40 W of E.I. du Pont de Nemours and Company, Inc.; or ethyl cellulose polymers, including, for instance, commercially available Ethocel™ std 4, 7, 10 or 20 of The Dow Chemical Company.

As mentioned, adhesives may, in some embodiments, be used to form thin coating layers over the entire surface of the membrane and/or the substrate, or over a region of either one or both of the aforesaid surfaces so that transfer and/or adhesion may be facilitated. Similar adhesive materials may be used for such purposes, alone or in combination. Thin coating layers not exceeding in total 2 μm when dry, such as being 1 μm thick or less when dry, or such as being 0.5 μm thick or less when dry, can be applied by any suitable method. Coating methods include, by way of non-limiting example, spray coating, rod coating, flexographic printing, and screen printing.

Glass frits may or may not be used, depending on the type of insulating substrates. Glass frits suitable for vitreous substrates or substrates having a vitreous surface are generally made of the following glasses: i) Lead oxide (PbO) based glasses, usually lead borosilicate glass: $PbO$—$SiO_2$—$B_2O_3$; ii) Bismuth oxide ($Bi_2O_3$) based glasses, usually bismuth borosilicate glass: $Bi_2O_3$—$SiO_2$—$B_2O_3$; and iii) Tellurium oxide ($Tl_2O$) based glasses.

Each of the above glasses may also contain one or more of the following: aluminum oxide ($Al_2O_3$), bismuth oxide ($Bi_2O_3$), boron oxide ($B_2O_3$), lead oxide (PbO), molybdenum oxide ($MoO_2$), silicon oxide ($SiO_2$), tellurium oxide ($Tl_2O$), tungsten oxide ($WO_3$), and zinc oxide (ZnO).

Glass frits, when present, may etch the outer surface of the substrate upon firing. Substrates prepared by lamination of membranes and transfer of patterns according to the present teachings may therefore be identified by the presence of fire-through contact etching underneath the fired conductors.

A suitable amount of electrically conductive particles (including glass frits when present) is 30-95 vol. % with respect to all solids (e.g., electrically conductive particles, adhesives and glass frits, if present), more preferably 65-90 vol. % for the metal paste and more preferably 50-70% vol. % from all solids for the adhesive paste. The amount of glass frits, when present, is generally 0.5-15 vol. % of the electrically conductive particles, preferably in the range of 1-5 vol. %.

A suitable amount of adhesive: 5-70 vol. % with respect to all solids (e.g., electrically conductive particles and adhesives, including glass frits, if present), preferably within 30-50 vol. % of solids for the adhesive paste, and preferably within 10-35 vol. % of solids for the metal paste.

Optional plasticizers can be phthalates, phosphates, glycerides, and esters of higher fatty acids and amides. For example, when needed, a plasticizer can be one or more of the group comprising dibutyl sebacate, butyl stearate, glycol esters of coconut oil fatty acids, butyl ricinoleate, dibutyl phthalate, castor oil, butyl stearate, diphenyl phthalate, dicyclohexyl phthalate, and dioctyl phthalate. If present, a plasticizer can be found at 5-30 wt. % with respect to the adhesive.

The electrically conductive particles and adhesives can be mixed in a liquid carrier, to form the composition 120 that is used to fill the grooves 110. Preferably, the amount of carrier should be sufficiently low to shorten the time needed to eliminate it when drying the composition. On the other hand, the amount of carrier may need to be sufficient to provide suitable flowability to the composition, allowing the composition to fill the grooves relatively rapidly and excess thereof to be removed relatively easily from the surface of the membrane. Typically, the liquid carrier is present in the composition in the range of 30-80 vol. % of the total paste.

The liquid carrier may be aqueous, organic, or consist of mixtures thereof. Organic solvents are preferably volatile and can, for example, be selected from the group comprising linear or branched C1-C7 alcohols and C1-C7 alkyl acetates, any such solvent preferably being of high purity of 95% or more, typically above 98%. Such alcohols can be one or more of methanol, ethanol, n-propanol, isopropanol, n-butanol, isobutanol, pentanol, hexanol and heptanol. Such alkyl acetates can be one or more of methyl acetate, ethyl acetate, n-propyl acetate, isopropyl acetate, n-butyl acetate, isobutyl acetate, pentyl acetate, hexyl acetate and heptyl acetate.

As explained, the composition 120 may be applied in consecutive steps, the elimination of the liquid carrier in between such steps resulting in relative shrinkage of the dried composition as compared to the wet composition.

It is to be understood that intermediate drying of the composition during first fillings providing for a partial filling of the grooves need not necessarily be as extensive as the drying performed subsequent to the last filling step. As used herein, a "dried" or "substantially dried" composition may retain residual amount of liquid carrier, as long as such presence does not hamper the structural integrity of the patterned conductors so dried or any other aspect of the process. A composition comprising less the 5 vol. %, and preferably less than 2 vol. % or even less than 1 vol. % can be considered "dried".

Once the dry composition substantially fills the grooves (see, 140 in FIG. 1B or any of 140a-d in FIG. 3) and levels with the first surface of the membrane, the flexible membrane bearing metal pattern is ready for further processing, which however need not be performed by the same entity, nor in temporal proximity to the filling step. In such case, the steps preceding and following the contacting of the first surface of the membrane with the electrically insulating substrate can be temporally separated.

For instance, once a length of membrane has been made by its manufacturer, it may be packaged and sent to an end user who will use the membrane to form conductors on circuit boards. The membrane may be packaged in coils. To prevent the composition from adhering to the opposite side of the membrane when it is coiled, the second surface of the membrane may have "non-stick" properties with respect to the first surface of the membrane. Alternatively, a protective sheet, preferably having a release surface (e.g., hydrophobic), may be applied to the membrane to be peeled away from it prior to the next step in the process.

FIG. 1C shows the next step (which can be performed by the same or a different entity) in which the membrane 100 is brought into contact with the substrate 150 and the two are passed through a nip 156 between two pressure rollers 152, 154 to cause the composition 140 within the grooves of the membrane to adhere to the surface of the substrate 150. At least one of pressure rollers 152 and 154 can be heated to a temperature typically in the range of 60-200° C. to further facilitate the transfer In some embodiments, the substrate and/or the membrane may additionally or alternatively be preheated before reaching nip 156. For example, the substrate may be heated to about 150° C. upstream of pressure rollers 152 and 154, and one or both of pressure rollers 152 and 154 may be heated to about 60° C.

In such a case, wherein the substrate, the membrane and/or the pressure rollers can be heated, the transferring composition may also be called a molten paste. This step may also be referred to as the lamination stage.

It should be noted that for transferring a pattern by lamination of a flexible membrane on a substrate, pressure rollers 152 and 154 typically have a relatively low hardness, as compared to traditional printing methods (such as gravure or intaglio printing, where the image-bearing plate or image-bearing cylinder at an impression nip, are typically relatively harder).

In some embodiments, pressure roller 152 and/or 154 is coated with a material (e.g., a polymeric compound or blend) so as to provide on its outer surface a hardness of no more than 70 Shore A, no more than 60 Shore A, no more than 50 Shore A, or no more than 40 Shore A. In some embodiments, pressure rollers 152 and 154, if coated, have an outer surface hardness of at least 10 Shore 00, at least 30 Shore 00, at least 50 Shore 00 (which approximately correspond to 10 Shore A), at least 20 Shore A, or at least 30 Shore A.

Last, in FIG. 1D, a portion of the membrane 100 of which the composition was already brought into contact with the substrate 150 is pulled away from the substrate 150 in the general direction of the arrow 160 while the membrane 100 continues to be held against the substrate 150 by a roller 170 at the point of separation, so as to peel the membrane 100 at a known region away from the substrate leaving composition 140' adhering to the substrate 150.

It is to be noted that if the membrane is not immediately peeled away from the surface following transfer, the prolonged contact between the pattern included in the membrane and the substrate may facilitate adhesion and/or extractability of the pattern. At the transfer nip 156, the membrane passes between two pressure rollers 152, 154, and at roller 170, the membrane is separated from the substrate. During the time that it takes for the membrane to travel from transfer nip 156, to roller 170, the membrane and its underlying substrate may spontaneously cool down to a predetermined temperature (e.g., ambient temperature or any temperature below the softening point temperature of adhesives and below the softening temperature of the membrane). For example, cooling by air may take about half a minute, to cool down the membrane and its underlying substrate by about 88% of the difference between the initial temperature and ambient temperature, e.g., to cool down from about 150° C. to about 40° C., assuming ambient temperature of about 25° C. In some embodiments, the membrane and/or the substrate may actively be refrigerated (e.g., by blowing cool air or contacting with a heat sink/cooled surface) in a region spanning from nip 156 to roller 170, which can be referred to as the "pre-peeling region". For example, while the substrate and membrane are in contact with a heat sink, cooling may be performed to the predetermined temperature (e.g., ambient temperature or any temperature below the softening point temperature of adhesives and below the softening temperature of the membrane). Such cooling may take, for instance, about half a second to about a second and a half, to cool down the membrane and its underlying substrate by about 88% of the difference between the initial temperature and ambient temperature, e.g., to cool down from about 150° C. to about 40° C., assuming ambient temperature of about 25° C.

A reduction of temperature in the pre-peeling region, e.g., spontaneously or by active refrigeration, as compared to a temperature that may have been applied during transfer at nip 156, can, in some embodiments, accelerate or otherwise facilitate the adhesion of the base of the pattern to the substrate. For instance, cooling may accelerate the hardening of hot melt adhesives, accelerating the formation of stronger structures within the grooves and at the interface with the substrate. The duration of time that it would take for a leading edge of the membrane to traverse the pre-peeling region depends on the speed of the membrane and can be termed a "pre-peeling period". The existence of a pre-peeling period may, in some embodiments, preclude the need for any adhesive coating over the surface of the membrane and the substrate. Nevertheless, if an adhesive coating is desired on one or both of the surfaces of the membrane and the substrate in contact in the pre-peeling region, in order to facilitate adhesion to the substrate and/or extractability of the pattern, such adhesive could be applied as thin layers, e.g., not exceeding 2 μm in total when dry. In some embodiments in which an adhesive coating is applied to the membrane and/or the substrate, the adhesive coating may be dried prior to bringing the membrane into contact with the substrate.

Composition 140' that remain on the substrate following the peeling of the flexible membrane may not yet be electrically conductive but the electrically conductive particles in the composition may be sintered, fused, or otherwise transformed into a conductive state. Different sintering methods exist, including thermal sintering, light induced sintering, microwave sintering, electrical sintering and chemical sintering, the elected sintering method being dependent upon the compositions and preferred process conditions. These may in turn be dictated by the intended end-product. Generally sintering is performed by the application of heat to form a conductor pattern matching the pattern on the die roller 102 of FIG. 1A.

If the conductive pattern is applied to an electrically insulating substrate having a vitreous surface, the composition including the electrically conductive particles and the adhesive, may, in some embodiments, further include glass frits to further improve the adhesion of the conductive pattern to such a substrate, when relevant. While in the absence of such glass frits, sintering of the electrically conductive particles may be carried out at a sintering temperature within a range of about 100-150° C. to about 800° C., the addition of such materials may require increasing the sintering temperature of the conductive pattern on the insulating substrate to a range of about 500° C. to about 900° C., or even more if the insulating substrate withstands higher temperatures.

It is noted, that the relatively low amount of adhesive material in the grooves (e.g., not exceeding 60% per volume (v. %) of the composition, being less than 50 v. %, or less than 40 v. %) and the relatively low amount, if any, of adhesive material on the surface of the membrane and/or the substrate (e.g., forming a coating having a dried thickness not exceeding 2 μm), allows for a relatively short duration during which the substrate and its pattern are sintered as compared to methods heavily relying on the presence of such adhesive materials. Having fewer adhesive compounds to eliminate, a pattern prepared according to the present teachings could, for instance, have thermal energy applied to the substrate in temperatures ramping up to a high maximum temperature (e.g., 500-700° C., depending on the conductive material to be sintered) or more, for a duration that does not exceed about two minutes (e.g., instead of an expected duration of tens of minutes or even hours for electrically insulated substrates produced by methods where adhesive materials are present in relatively high amounts). Such a shorter duration may enable more electrically insulated substrates to be produced in a given amount of time (high-throughput), compared to electrically insulated substrates produced by processes which include a longer duration of application of thermal energy (low-throughput).

It is further noted however, that the maximum allowable temperature may be additionally dependent on the type of substrate. In some embodiments, the maximum temperature that may be used may be lower (e.g., 300° C.), because the substrate may not be capable of withstanding a higher maximum temperature. The duration may consequently be longer than if a higher maximum temperature were used instead. It is expected that electrical conductors rendered electrically conductive using a higher maximum temperature would have a higher conductance than electrical conductors rendered electrically conductive using a lower maximum temperature. For some applications (e.g., for conducting signals via the traces) the electrical conductance of the conductors resulting from either a high or a low maximum temperature may be sufficient.

During the filling of the grooves 110 in the membrane 100 with composition 120, the composition may optionally be rendered more flowable by addition of a solvent, which as above-detailed may be an aqueous or an organic solvent. In such a case, the composition may shrink as it dries and will not totally fill the grooves. FIG. 3A-3D schematically show optional steps to solve, and optionally utilize, such phenomenon.

Figure 3A:
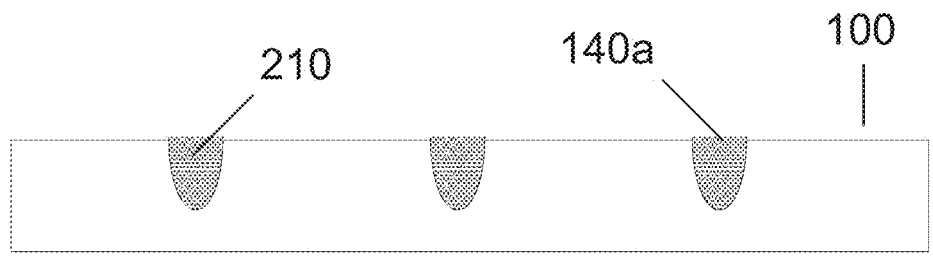
FIG. 3A is a section through a membrane showing how a single composition may be applied within grooves in the membrane.

In FIG. 3A, the grooves are filled with a unique composition 210. Such substantially complete loading of the groove by any composition may result from consecutive filling of the grooves, the volume of which reduces with each drying of each applied volume of the same composition. When the dried composition 210 is level with the surface of the membrane 100, the structure shown as 140*a* is formed. The number of consecutive filling cycles necessary to entirely fill a groove may depend upon the composition, the groove dimensions and the process operating conditions, but typically do not exceed five cycles, three or four cycles being preferred.

Figure 3B:
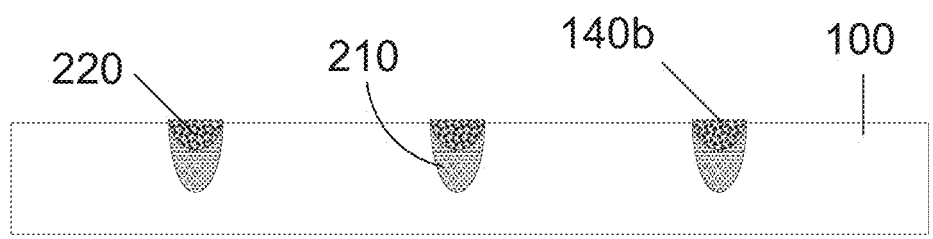
FIG. 3B is a section through a membrane showing how two distinct compositions may be consecutively applied in the groove in the membrane.

The effect of the composition 210 shrinking away from the surface of the membrane 100 upon drying, is better seen in FIG. 3B, in which the dip left by composition 210, applied and dried in a first step, is filled in a second step, which in the depicted example utilizes a second composition 220. This may be repeated as necessary to ensure that the grooves 110 are eventually filled to substantially the level of the surface of the membrane 100. When the dried composition 220 is substantially level with the surface of the membrane 100, the structure shown as 140*b* is formed.

When successive steps and/or cycles are performed to fill the grooves, the constituents of the composition may vary between steps/cycles.

In essence, only the last applied composition is required to have sufficient adhesiveness to adhere to the substrate while in earlier steps the adhesive is only required to hold the electrically conductive particles together. Therefore, while in FIG. 3A, the composition 210 may comprise a relatively potent adhesive, being the sole composition forming the filled groove 140*a*, in FIG. 3B, composition 220 would have to satisfy this purpose. Composition 210 in the latter figure may therefore comprise either a "poor adhesive" binder or a potent adhesive. The transfer of an intact composition/line to the substrate may be more challenging for grooves with higher aspect ratios. Therefore in some embodiments, the adhesive used to hold the electrically conductive particles together for high aspect ratios may be more potent than the potency of an adhesive used to hold electrically conductive particles together for grooves with lower aspect ratios.

Additionally or alternatively, the electrically conductive particles, or blends thereof, and/or the particle size used for each composition of each filling repeat may differ from filling to filling. For example, if an individual groove comprises relatively shallow trench segments for forming a trace and relatively deep indentations for forming solder bumps, the composition of the earlier fillings for the relatively deep indentations may be appropriate for the solder bumps, and the composition of the later fillings for the relatively deep indentations may resemble the composition for the shallow trenches.

Figure 3C:
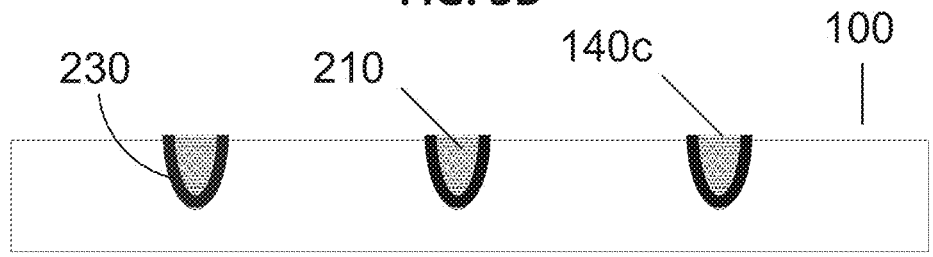
FIG. 3C is a section through a membrane showing how a release layer may first be applied to assist in separation of the composition from the membrane.

In FIG. 3C, a release coating 230 that separates easily from the membrane 100 is used to line the grooves before they are filled with a composition containing electrically conductive particles, to form the filled groove cross-section shown at 140*c*. Of course, this could alternatively be a multi-layer structure having additional further composition layers with a higher concentration of adhesive by way of example, such as the composition 220. Hence, in some embodiments the conductors that can be obtained by the present method may have a multi-layered structure. As noted above, the intact transfer of a composition/line from grooves having higher aspect ratios may be more challenging than the intact transfer of the composition/line from grooves having lower aspect ratios. Usage of a release coating may assist in the intact transfer of the composition, especially for grooves with higher aspect ratios.

A release coating 230 may consist of a relatively diluted polymer, in an organic solvent (e.g., a C1-C7 alcohol such as butanol). The "release" polymer has poor adhesion to the surface of the membrane and preferably has a relatively low ash content, allowing for its substantially complete elimination (e.g., by combustion) at a later stage, if it is transferred with the metal particles. In some cases, the polymer of the release composition can be compatible (e.g., adhesion wise) with the compositions to be poured thereupon. Thus, the release composition, once dried, may either remain attached to the grooves' walls or transfer with the composition.

The "release" polymer can be, for example, a water-insoluble ethylcellulose polymer or a water-soluble cellulose ether, depending on the preferred vehicle of such a release coating. The polymer concentration typically does not exceed 10 wt. %, compositions consisting of 5 wt. % or less being favored. As other compositions, the release composition can be applied to fill the grooves with a squeegee, the organic solvent being eliminated by drying. In view of the low polymer content, a dried release composition generally forms upon the walls of the grooves as a film of 1-2 μm or less. If desired, a second layer of release composition can be similarly applied.

The release coating 230 may for example consist 5 wt. % water-insoluble ethyl cellulose (such as available as Ethocel™ Std 100, of The Dow Chemical Company) in 1-butanol (Sigma Aldrich). Alternatively, if aqueous compositions are preferred, the release coating may consist of 10 wt. % water soluble cellulose ether (such as available as Methocel™ E15, of The Dow Chemical Company) in deionized water.

It is to be noted that when the compositions used for the loading of the grooves, as well as for the optional pre-coating with a release coating and/or post-coating with an adhesive coating are all aqueous (e.g., water constituting at least 60 wt. % of a liquid carrier of the composition), it can be desirable to treat the flexible membrane (generally hydrophobic) to facilitate its even wetting by these compositions. Such a treatment, which can be achieved by corona, can be preferably performed once the release coating, if present, has been applied and dried within the grooves, but can also be performed, if at all, before the application of a release coating.

Figure 3D:
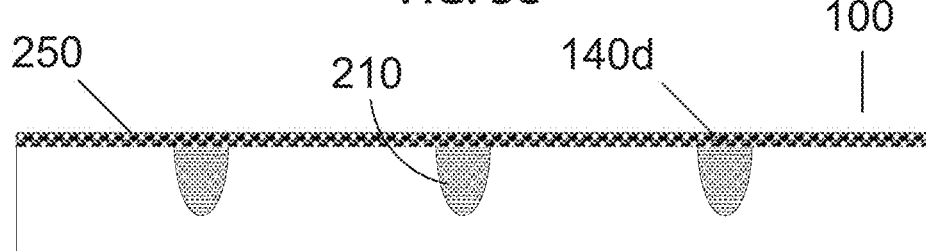
FIG. 3D is a section through a membrane showing how an adhesive coating may be applied to cover the entire surface of the membrane to assist in the transfer of the composition from the membrane to the substrate.

FIG. 3D shows an optional structure 140d that in addition to the composition 210 filling the grooves has an adhesive coating 250 that covers the entire surface of the membrane. The adhesive coating 250 is intended to assist in the transfer the composition from the grooves to the substrate. The surface of the substrate can be, if desired, subsequently washed with a solvent to remove the adhesive from all the areas where it is exposed and does not lie beneath the composition. In most cases, however, removing the adhesive coating by the use a solvent may prove unnecessary as it will be burned away upon sintering (and/or further firing) of the composition transferred to the substrate.

Though the structure 140d is shown in FIG. 3D as comprising a single composition 210, it may be formed from of multiple layers as described with reference to FIG. 3B and FIG. 3C.

An adhesive coating 250 may consist of the same potent organic adhesives as previously mentioned (but be devoid of glass frits), such adhesives being now dispersed or dissolved in a carrier that would not negatively affect the structural integrity of the dried compositions filling the grooves. The amount of adhesive polymer in such an inert carrier can be in the range of 5-50 wt. % of the adhesive coating composition. The "inert" carrier can be at least one of the organic solvents previously detailed, the volatility of such solvents shortening the time such compositions may affect the previously applied and dried compositions. Subsequent to its drying, the adhesive coating should preferably have a thickness within a range of 0.2-3 μm or 0.2-2 μm.

The adhesive coating 250 may for example consist of 5 wt. % polyamide hot melt adhesive (Uni-Rez® 2720), 15 wt. % butanol (Sigma Aldrich) and 80 wt. % pentyl acetate (Sigma Aldrich). Alternatively, if aqueous compositions are preferred, the adhesive coating may consist of 5 wt. % water soluble adhesive made of poly(2-ethyl-2-oxazoline) (such as available as Aquazol® 5, by Polymer Chemistry Innovations), 1 wt. % cosolvent, such as butanol, 0.25 wt. % of a first wetting agent, such as a silicone surfactant (as BYK®-349 by BYK), 0.075 wt. % of a second wetting agent, such as a silicone surfactant (as BYK®-333 by BYK) in deionized water.

Other Electrodes

Figure 4A:
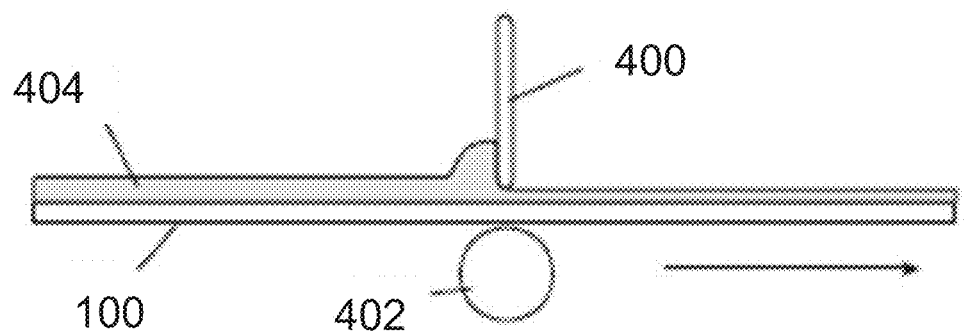
FIGS. 4A to 4C show how an electrode, such as the ground electrode of a pattern applied on an insulating substrate by way of example, may be formed and applied to a large surface.
Figure 4B:
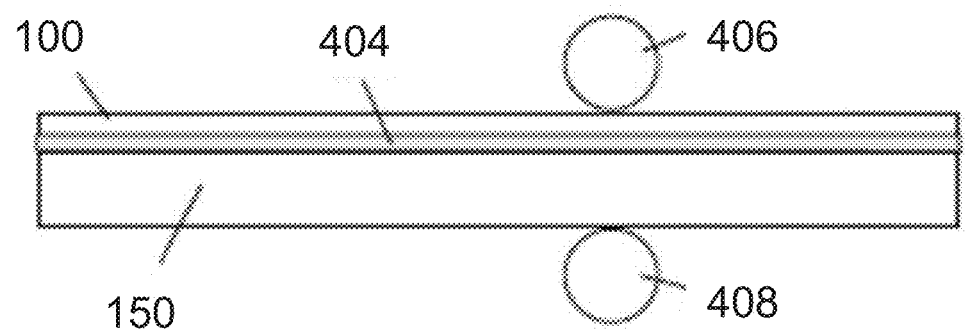
Figure 4C:
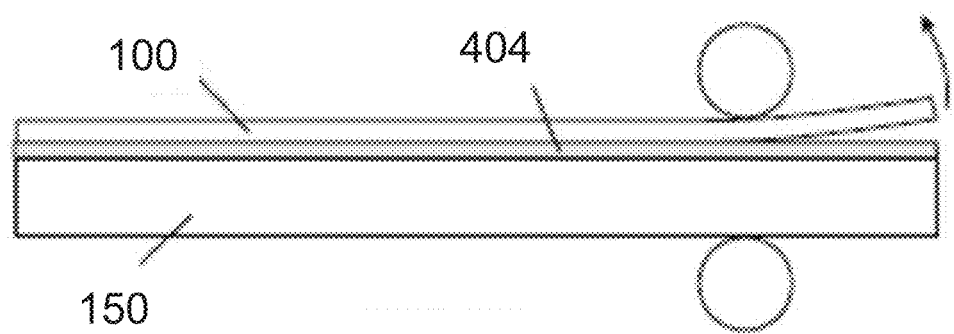

The processes as described above are better suited for forming thin conductors but when coating a large surface with an electrode is desired, such as the ground electrode of a PCB by way of example, the process can be considerably simplified as shown in FIGS. 4A to 4C. In FIG. 4A, a doctor blade having a rounded tip is pressed against the membrane 100 as it passes between a pressure roller 402 and the doctor blade 400. An excess of composition 404 (which for a ground plane can be of copper) is applied to the membrane 100 upstream the doctor blade 400 and its thickness is reduced uniformly as it passes beneath the doctor blade. The thickness can be set by varying the radius of curvature of the tip of the doctor blade 400 and the applied pressure. The excess composition need not be applied along the entire length of the doctor blade or the doctor blade may be optionally "segmented" the composition being layered within a desired portion of the membrane. The composition 404 can then be dried.

The membrane 100 carrying dried composition 404 is then pressed against the substrate 150 as shown in FIG. 4B by passing it through the nip between two pressure rollers 406 and 408 (e.g., having an outer surface hardness within a range of 10 shore 00 to 70 shore A). Pressure rollers 406 and 408 can be further heated to facilitate the transfer of compositions including an adhesive having a softening point at transfer temperature. The membrane 100 can then be peeled away from the substrate 150 as shown in FIG. 4C to leave a coating of the composition 404 on the substrate. Between the time that membrane 100 and substrate 150 pass through the nip, and the time that membrane 100 is peeled away from substrate 150, membrane 100 and/or underlying substrate 150 may cool down spontaneously or by active refrigeration. The coating of dried composition 404 can then be sintered (e.g., heated to render it conductive onto the substrate 150). In some embodiments, the thermal energy may ramp up to a high maximum temperature (e.g., 700° C.) or more, and the duration of the application of thermal energy may not exceed two minutes.

It will be appreciated that the laminating steps shown in FIG. 1C and FIG. 4B can be carried out at the same time. This enables a large area electrode to be applied to one surface of a circuit board at the same time as a conductive grid pattern is applied to its opposite surface. The sintering, or otherwise adhesion, of the composition on both sides of the electrically insulating substrate may then be conducted at the same time.

Example of a Conductive Pattern

Figures 5A, 5B:
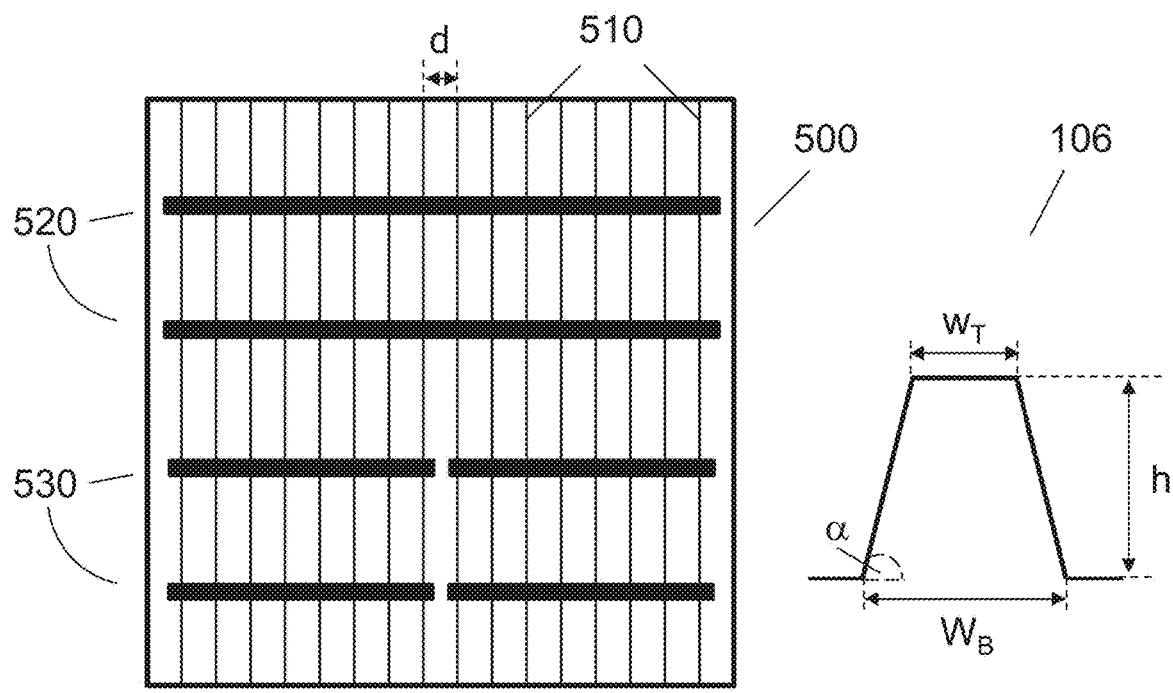
FIG. 5A schematically illustrates an exemplary metallic pattern as generated by the present method.
FIG. 5B schematically illustrates an exemplary cross section through a protruding die rule, which is similar in shape to a cross section through a transferred conductive line before and after sintering and comparable to a negative image of a cross section through a groove.

A conductive metal pattern was prepared according to the above principles, schematically summarized in FIG. 5A. In the figure, a metal pattern 500 is illustrated. Such a pattern can be "negative", below the surface of the membrane when the dried compositions substantially fill the grooves, or "positive" protruding above the substrate after transfer. The longitudinal grooves of metal lines 510 result from rules 106 (see, FIG. 1A or FIG. 2A-2B), whereas transverse grooves or metal lines are shown as 520, if "uninterrupted" traversing all longitudinal lines of the metal pattern, or 530, if traversing only a subset of lines 510. In any event, transverse grooves or lines 520 and 530 result from rules 108 (see, FIG. 1A or FIG. 2A).

For simplicity, any electrical conductor other than a conductive line (regardless of shape) in an electrically conductive pattern prepared by the present method can be considered as a "connector" regardless of shape and elements being connectable therewith. Such a connector may serve as an "intra-connector" connecting at least part of the conductive lines of the electrically conductive pattern one with another, or may serve as an "inter-connector" connecting at least part of the electrically conductive pattern to an external circuitry or a separate electrically conductive pattern. The two types of connectors are not mutually exclusive and an intra-connector may additionally serve as an inter-connector. Therefore, a pattern of electrical conductors, and an electrically conductive pattern resulting from the sintering and optional firing of the same following application to a substrate, may include conductive lines (e.g., traces considering the example of a PCB) and may optionally include connectors. In some embodiment, connectors may be applied by any suitable method to an electrically insulating substrate following transfer by the present method of electrical conductors due to serve as conductive lines.

The flexible membrane used in the present example was a cast polypropylene film (50 μm thick CPP; RollCast™ 14 of R.O.P. Ltd). It was patterned with a rotatable die 102 wherein a nickel shim provided for a series of about 85 rules 106 for the formation of the longitudinal grooves. The edges of rules 106 were trapezoidal, as shown in FIG. 5B, with a base having a width $W_B$ of 20 μm, a flat top having a width $w_T$ of 12 μm, and a height h of 32 μm. The distance d between adjacent rules was of 1.8 mm. The length of each rule along the circumference of the roller 102 was set to be compatible with the solid support to which the metal pattern would be transferred (including "margins" in between patterns, if desired). The rotatable die 102 formed a patterning nip with a counter die (e.g., cylinder 104), the pattern of grooves being formed as the membrane passed through the nip.

The grooves so formed (having a base $W_B$ of about 25 μm, a top $w_T$ of 12 μm and a depth (height h) of about 25 μm, the distance between the facing edges of two adjacent grooves being of about 1,775 μm) were filled with a release composition consisting of 5 wt. % Ethocel™ Std. 100 (The Dow Chemical Company) in 1-butanol (Sigma Aldrich). The composition was applied to the patterned membrane using a doctor blade (MDC Longlife Multiblade, Daetwyler) positioned at an angle of 65-70° to the surface normal. The stainless steel beveled blade had a width of 20 mm, a thickness of 0.2 mm, a bevel angle of 3°, a bevel length of 2.7 mm and a tip radius of 18 μm. The force used was of 3N/cm. The doctor blade was parallel to the axis of rotating die 102, perpendicular to the grooves generated by rule 106, and in relative motion with the flexible membrane, the moving direction being parallel to lines 510. The membrane was then heated with a hot air gun until the release composition became a substantially dry film. The heating/drying temperature was selected to prevent membrane deformation (<70° C. for CPP). In the present example, the release composition was applied in a single step.

After the formation of a thin release film coating the walls of the grooves, a metal paste was loaded within the grooves. The metal paste included a) silver particles (1-3 μm beads) and lead oxide based glass frits (1-3 μm chunks), the foregoing constituting about 60 vol. % of the solids, glass frits being present at approximately 3-5 vol. % of the electrically conductive particles; b) a polyamide adhesive, Uni-Rez® 2720 or Uni-Rez® 147, constituting about 40 vol. % of the solids; and pentanol, constituting 40 vol. % of the total paste. When converted to wt. % of the total composition, such metal paste was composed of 87.3-88.7 wt. % silver particles, 1.3-2.7 wt. % glass frits, 6 wt. % adhesive and 4 wt. % carrier.

Each loading step of the metal paste was followed by a substantial elimination of the organic carrier and drying of the composition with a hot air gun. It typically took three passes to fully fill the grooves, level with the surface of the flexible membrane.

If an additional adhesive coating layer was desired, it was applied by a 6 μm wire bar, the dried adhesive coating having a thickness of less than 2 μm. The adhesive coating applied in some experiments included 10 wt. % of Uni-Rez® 2720, in a mixture of solvents consisting of butanol and pentyl acetate (at a weight per weight ratio of 1:5). Alternative adhesive coatings were prepared using additional polyamide hot melt adhesives including Uni-Rez® 2620 of Kraton Corporation, USA, Macromelt® 6211, Macromelt® 6224, Macromelt® 6238 and Macromelt® 6239, of Henkel, Germany, and Versamid® 744 and Versamid® 754 of Gabriel Performance Products, USA. 10 wt. % of each polyamide hot melt adhesive was mixed with 90 wt. % of organic solvents. The Macromelt® and Versamid® polyamide adhesives were blended in propylene glycol methyl ether (such as commercially available as Dowanol™ PM from the Dow Chemical Company). The Uni-Rez® 2620 and Uni-Rez® 2720 polyamide adhesives were applied in further additional solvents, each having been blended in (a) 90 wt. % butanol, (b) 90 wt. % pentanol, (c) 15 wt. % butanol and 75 wt. % amyl acetate and (d) 15 wt. % pentanol and 75 wt. % amyl acetate; all solvents being supplied by Sigma-Aldrich at purity level of at least 95%. All afore-said adhesive coating compositions based on polyamide hot melt adhesives were found satisfactory for the transfer of patterns from the membrane to the substrate.

In an additional series of experiments, different adhesive polymers were tested and found similarly suitable. The three further alternative adhesive coatings consisted of (a) 20 wt. % of a fully hydrogenated gum Rosin (Foral™ AX-E by Eastman Chemical Company) in 80 wt. % Dowanol™ PM, and (b) 10 wt. % of a terpene phenolic resin (Sylvaprint® 3523 or Sylvaprint® 7002 by Arizona Chemical) in 90 wt. % Dowanol™ PM.

Figure 5C:
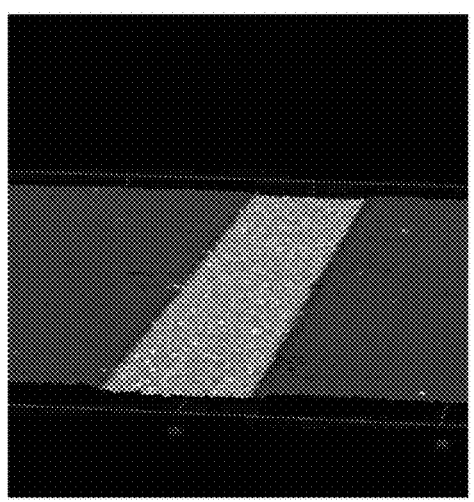
FIG. 5C is a perspective micrograph taken by confocal laser scanning microscopy of a groove of a flexible membrane, the groove being filled with a composition including electrically conductive particles.

FIG. 5C shows a micrograph picture taken by confocal laser scanning microscope showing a groove of a flexible substrate filled with metal paste (see for example 140 in FIG. 1A). As can be seen, the groove is substantially filled to the level of the surface of the flexible membrane, while the areas surrounding it are substantially free of dried composition. For such picture, an adhesive coating was omitted.

The flexible membrane including the patterned grooves filled with dry composition was contacted with a vitreous substrate having a square shape of about 156 mm side and a thickness of about 200 μm. The membrane was pressed against the substrate at a pressure of 6 Kg/cm², by passing through a nip 156 at a speed of 5 cm/s. Pressure rollers 152 and 154 were heated to about 130-140° C. The adhesive coating, if any, flowed into the surface texture of the substrate, to which it adhered after cooling of the substrate back to about ambient temperature. The CPP membrane was then peeled off the substrate, while the coating layer of adhesive and the metal pattern transferred to the substrate and remained thereon following the removal of the membrane. The transferred metal patterns were sintered at a temperature profile reaching a peak temperature of about 750° C. in a solar belt furnace Despatch CDF-SL. The patterns so treated were at a temperature of 700° C. or higher typically for at least 5 to 20 seconds, before being cooled back to ambient temperature.

Figure 5D:
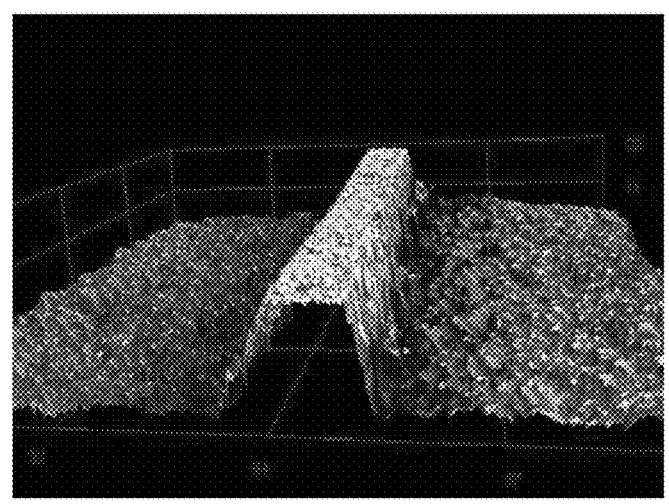
FIG. 5D is a perspective micrograph taken by confocal laser scanning microscopy of a conductive line transferred from a groove of a flexible membrane to a substrate.

FIG. 5D shows a micrograph picture taken by confocal laser scanning microscope (LEXT OLS4000 3D of Olympus Corporation) showing a conductive line made of metal paste (as filled in the groove shown in FIG. 5C) transferred to a substrate (see for example 140' in FIG. 1D) and sintered as above-described. As seen from the figure, the sintered metal line substantially retained the shape of the rules defining the grooves wherein it was prepared.

It is an advantage of the process of the present disclosure that the conductors can be very narrow (e.g., ~20-25 μm or less, half or less than typical art values), while retaining a sufficient height, as can be assessed by a relatively high aspect ratio, ASP being about 1:1 in the present example.

An alternative conductive pattern was similarly prepared on an insulating substrate having a vitreous surface, using the same membrane and pattern of grooves, by replacing the above described non-aqueous compositions by aqueous ones. The release coating was prepared using a release composition including 10 wt. % Methocel™ E15 (The Dow Chemical Company) in deionized water. The release composition was twice applied and dried, following which the grooved side of membrane was exposed to close corona treatment (BD-20AC Laboratory Corona Treater, by Electro-Technic Products).

A water-based metal paste was then loaded within the grooves. The metal paste included a) silver particles (1-3 μm beads) and lead oxide based glass frits (1-3 μm chunks), the foregoing constituting about 60 vol. % of the solids, glass frits being present at approximately 3-5 vol. % of the electrically conductive particles; b) a poly(2-ethyl-2-oxazoline) adhesive, Aquazol® 5, constituting about 40 vol. % of the solids; and deionized water, constituting 40 vol. % of the total paste. When converted to wt. % of the total composition, such metal paste was composed of 87.3-88.7 wt. % silver particles, 1.3-2.7 wt. % glass frits, 6 wt. % adhesive and 4 wt. % carrier. The aqueous metal pasted was loaded in six filling/drying steps.

Finally, a water based adhesive coating was applied to the entire surface of the loaded membrane. The aqueous adhesive coating consisted of 5 wt. % Aquazol® 5 (a poly(2-ethyl-2-oxazoline) by Polymer Chemistry Innovations), 1 wt. % butanol, 0.25 wt. % BYK®-349 and 0.075 wt. % BYK®-333 (both wetting agents by BYK), all in deionized water.

Printed Circuit Boards

In the conventional manufacture of printed circuit boards (PCBs), a substrate made of insulating material (e.g., fiberglass) is coated with a conducting layer (e.g., copper), a protective pattern is glued or otherwise coupled to the top of the insulating substrate, and portions of the conductive layer are mechanically or chemically removed, forming a pattern of conducting traces which are utilized to connect electrical components. In certain embodiments, the traces also provide mechanical support to electrical components known as surface mount devices. A PCB comprising the electrical components (e.g., resistors, capacitors and so on) is also termed a printed circuit assembly (PCA). The removal of the conductive material in such conventional methods is wasteful and costly.

Creating grooves in a membrane, filling the grooves with compositions (e.g., including electrically conductive particles) and transferring the compositions to an insulating substrate (in a process akin to the process described above) provides an efficient, precise and well controlled method for producing PCBs. It is noted that in contrast to the conventional manufacture of printed circuit boards in which the copper (or other metal) in a trace is continuous, a trace manufactured in accordance with the invention will have voids in between the particles (e.g., voids comprising approximately 20% of the trace). Such voids may be detected using any appropriate techniques, such as by way of an SEM, TEM, FIB, and/or by confocal laser scanning microscopy techniques and their relative amount per area (e.g., within the area of a cross-section of a trace) assessed by routine image analysis. In some embodiments, the voids may comprise at least 1% of the trace, at least 2% of the trace, at least 5% of the trace, at least 10% of the trace, at least 20% of the trace, or at least 30% of the trace per area of trace cross-section. In other words, electrical conductors of an electrically conductive pattern (i.e. following sintering) or at least part of the electrical conductors, for instance at least part of the conductive lines, consist of sintered electrically conductive particles and of voids between the sintered particles, the voids being present in at least 1%, at least 2%, at least 5%, at least 10%, at least 20%, or at least 30% by area of a cross section of the electrical conductors.

In addition to the grooves needed to produce the conductive traces, it is often necessary to provide contact pads and solder bumps onto which wires or components can be soldered to connect to the PCB conductive traces. Elevated contact pads may be produced, in some embodiments, by providing indentations in the flexible membrane that are deeper than the depths in the grooves for the traces. The indentation may be of a similar width or a different width than the width of the grooves for the traces, indentation for contact pads being typically wider. The electrical contact pads, which are in electrical communication with the conductors, may be of greater height above the insulating substrate than the other conductive traces (e.g., the contact pad being 15 μm higher than the top of the traces), to permit certain electrical connection to be made to the components of the circuit. The connections of solder bumps to the contact pads can be effected by soldering or fusing particulated solder. In alternative embodiments, where the top of a contact pad is substantially level with the top of a trace (e.g., +5 μm) the depths for the traces and for the contact pads may be substantially the same, and the widths may be similar or different. In such embodiments, an electrical conductor that is formed by way of a groove in the membrane may be covered by a solder mask (e.g., of polymer material), except for the segment or segments of the electrical conductor which will serve as one or more contact pads, for soldering solder bumps thereto. The covered part of the electrical conductor may serve as the trace.

The present method enables the formation of contact pads that are substantially flat on the surface of the substrate, the top of the contact pads and adjacent traces being at substantially similar height above the substrate, and/or of solder bumps with a diameter on the surface of the contact pad of at least 10 µm, or at least 12.5 µm, and a diameter of at most 14 µm, at most 19 µm, or at most 50 µm. Solder bumps applied by such method typically have a height (as measured with respect to the top of the contact pad) between 0.5-fold and 1.5-fold the diameter of the bump on the pad, and generally of about 1-fold. In some embodiments, the height of the solder bump on top of the contact pad is at least 8 µm, at least 10 µm, or at least 12.5 µm. In some embodiments, the height of the solder bump on top of the contact pad is at most 25 µm, at least 20 µm, or at least 15 µm. The present method allows the solder bumps applied thereby to reside exclusively within the boundaries of the top surface of the contact pad.

It should be noted that the ability to form such relatively small solder bumps by the present methods significantly contrasts with conventional technologies (e.g., dispensing or screen-printing) which typically allows for the formation of solder bumps having a diameter of more than 100 µm. While there have been reports of relatively small solder bumps (e.g., having a diameter of about 15-20 µm), such bumps require the growth of elevated contact pads (e.g., the contact pad being 15 µm higher than the top of the traces) typically formed by sequential metallization of a contact pad base. The contact pad so grown can be termed a pillar and its tip can then be capped by solder bump by dipping into a solder paste. The solder paste so applied to the pillar typically overflows and extend beyond the top face of the elevated pad, the resulting solder bump extending beyond the boundaries of the top face of the contact pad pillar. By the present method, even if a solder bump is applied on an elevated contact pad, it can be applied within the limits of the top face of the pad. The pillar-cap approach is deemed less suitable for PCB manufacturing, so that the present teachings provide an advantageous alternative in this particular field.

Certain integrated circuits are formed on a semiconductor wafer with conductive traces and/or pads formed on at least one side of the wafer. The process described above may be similarly used for providing such traces and/or pads.

In some embodiments, a multilayer PCB may be produced by repeating the present method a plurality of times. For example, a three-layer PCB may be produced as follows. A flexible membrane may be used to form a first pattern on a first insulating substrate which is later sintered to render the pattern electrically conductive. An insulating material may then be laid over the first pattern, thereby yielding a second electrically insulating substrate on which a second pattern may be formed using a flexible membrane. For example, the second pattern may be sintered to render the pattern electrically conductive and the pattern may include contact pads for vertical interconnect accesses (VIAs). An insulating material may then be laid over the second pattern, therefore yielding a third electrically insulating substrate on which a third pattern may be formed using a flexible membrane. The third pattern may be sintered to render the pattern electrically conductive.

A commonly used technique for coupling electronic components to an external circuit is colloquially known as 'flip-chip' technology. Other techniques exist including for instance Surface Mount Technology. Commonly such external circuit resides on a carrier such as a PCB or another component (e.g., a submount, an electronic device, etc.). The components, colloquially known as 'chips', are manufactured with contact pads or legs. A quantity of conductive material is deposited on the chip pads, forming what is colloquially known as 'bumps' or 'solder bumps'. Commonly bumps are deposited on a large number of chips at the same time, such as when manufacturing a plurality of chips on a single semiconductor wafer, which is then cut to individual chips or dies. To ease manufacturing, the bumps deposition is done with the chip pads facing upwardly. The chip is then turned over (flipped), and laid on the carrier in registration with a corresponding set of carrier contact pads, such that the bumps can electrically bridge between corresponding chip contact pads and carrier contact pads.

In certain applications the bumps are melted to form a permanent electrical bonding, between the corresponding chip and carrier pads. The re-molten bump material may also provide mechanical support for the chip. In other applications the chip is mechanically held against the carrier, where the bumps provide electrical bridging between the chip and carrier corresponding pads due to the mechanical pressure.

Appropriately dimensioned grooves or cavities in a membrane similar to the membrane 100 may be utilized to deposit the bumps to such a flip chip.

Such process allows optionally for sintering to occur after the chip is flipped and laid in registration, providing both sintering and adhesion to both the chip and carrier pads.

Moreover, in many flip-chip applications an electrically insulating adhesive is flowed into the small space left between the chip and carrier to provide added mechanical support, and/or heat transfer. In certain embodiments of the invention, the adhesive layer, if any, may be displaced during sintering to provide similar function to the insulating adhesive.

Plurality of Sets of Grooves

In the embodiments of the invention previously detailed, there was described a flexible membrane in which one pattern of grooves was formed, then loaded with the compositions of interest ahead of lamination upon the electrically insulating substrate of choice for transfer of the pattern of dried composition thereto. If distinct patterns (e.g., having different shapes, different dimensions, different profiles, different compositions and the like differences) are to be formed on a same substrate, the method according to the present teachings may be suitable. For example, a first membrane with a first pattern can be applied on a first surface of the substrate, while a second membrane with a second pattern can be applied on a second surface of the substrate. The first and second surface of the substrate can be on the same side of the substrate, typically in non-overlapping areas, but can also be on opposite sides. Moreover, each pattern in each membrane may be loaded with same or different compositions.

By way of example, the conductors of the first side can be formed by transfer of a first pattern of a first composition from a first membrane and the back electrode can be formed by transfer of a second pattern of a second composition from a second membrane. Preferably, the distinct patterns are concomitantly transferred during the lamination step in which pressure is simultaneously applied on both membranes each facing its respective face of the substrate.

Figure 6:
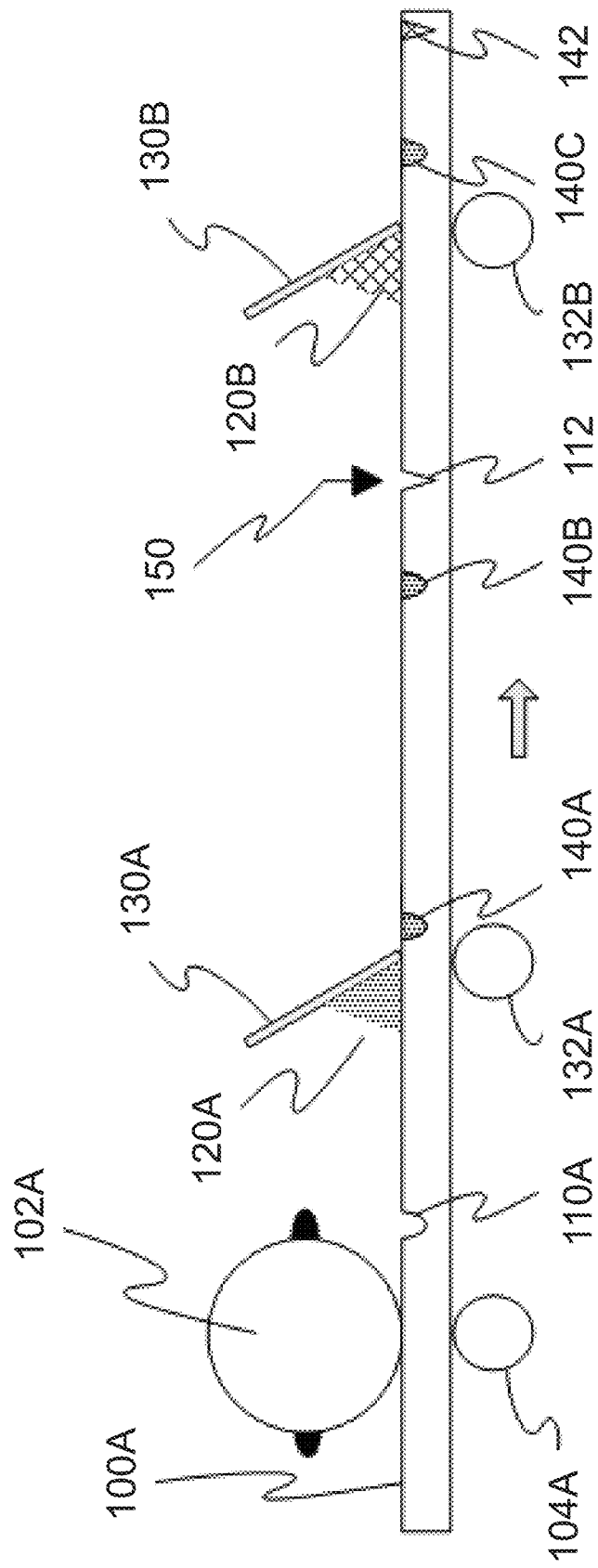
FIG. 6 schematically illustrates an exemplary cross-section of an apparatus for filling a plurality of groove sets with respective compositions.

Distinct patterns which are to be transferred to a same side of a substrate can advantageously be obtained using a single membrane as explained in the following. FIG. 6 represents a membrane having a plurality of sets of grooves, each filled with a different material. Such membrane may be utilized for providing differing patterns of materials on the substrate. The plurality of sets of grooves may each partially correspond to the desired pattern to be applied to the substrate. By way of example, the manufacturing of a PCB may benefit from depositing a second pattern interposed with and/or surrounding the PCB conductive traces or parts of them. Further by way of non-limiting example such a second pattern may introduce ceramic materials for protecting components, or introduce a pattern comprising ferromagnetic materials for controlling electromagnetic coupling or decoupling between traces and components of the PCB. In some embodiments, the second pattern (and the compositions forming it) provides a shielding effect to the first pattern. The shielding can reduce the coupling of radio waves, electromagnetic fields and/or electrostatic fields which can be generated during operation of the first pattern. Materials suitable for shielding, squelching undesired emissions (e.g., EMR, RFI, etc.) or otherwise attenuating any undesired phenomenon, are known and include, by way of non-limiting examples, copper and nickel. In alternative embodiments, the second pattern (and the compositions forming it) facilitate or enhance one or more effects of the first pattern when in operation, or any other desired phenomenon relating to the intended end-product.

In yet another embodiment, the second pattern is inert with respect to the first pattern (e.g., does not reduce or increase any effect of the first pattern when in operation). The second pattern can provide an alternative pattern of conductors or be a pattern of resilient materials which may be transferred by the membrane to the substrate to facilitate sealing the substrate or portions thereof. Such second patterns may additionally, by way of example, serve as compartmentalization lines or sub-systems boundaries, provides weatherproofing, facilitate heat dissipation, reduce noise or vibrations, and the like.

A second pattern 280 is schematically illustrated in FIG. 2D, the second pattern being part of another array of conductors illustrated by traces 260 and contact pads 270 of conductive pattern 300.

In FIG. 6 a groove pattern symbolized by groove 110A is embossed into membrane 100A. The first groove pattern is then filled by a first composition 120A, with the aid of a doctor blade 130A, the action of which being backed by pressure roller 132A, or by any other desired method. As described in more detail above, such as in relation to FIGS. 1A-1D, and 3A-3D, a plurality of filling steps may be utilized and a plurality of filling and/or drying stations and/or doctor blades may be utilized (not shown). Similarly, a cleaning station may be optionally included, so as to facilitate the removal of composition in the spaces between the grooves.

Once the grooves of the first pattern are filled as shown by way of example by 140A, 140B, 140C, etc. a second set of grooves symbolized by groove 112 is formed in the membrane. The second set of grooves is then filled by a second composition 120B utilizing doctor blade 130B, the action of which being backed by pressure roller 132B, or any other desired method. As the grooves of the first pattern 140A, 140B, 140C are already filled, the second composition 120B is applied to the grooves of the second pattern. The second sets of grooves may be filled by a single or a plurality of filling steps, doctor blades, flowing aids and like, until a desired level of fill 142 is achieved. Thus, the membrane may carry a plurality of groove patterns and each of the groove patterns may utilize a composition providing a desired set of characteristics. While in this figure, the two patterns of grooves are respectively illustrated by grooves 110A and 112, which may seem parallel one to the other in the represented view, this need not be the case and the grooves of one pattern may assume any desired position and orientation with respect to the grooves of the second pattern.

FIG. 6 also shows that different methods may be utilized to form the grooves. While the first set of grooves is depicted as being formed by embossing by die roller 102A (104A representing a corresponding pressure roller or counter die), the second set of grooves are formed utilizing an alternative method symbolized by the numeral 150. Such groove forming device may be one of many devices, ranging from a dedicated punch to a laser source for selectively ablating parts of the membrane 100A or in certain cases for causing membrane shrinkage by heating. Alternatively, the pattern of grooves can be formed on a flexible membrane by a patterning technique, such as photolithography.

Once the membrane grooves are filled with various compositions, an adhesive coating may be applied, as illustrated by 250 seen for example in FIG. 3D, and the membrane may be brought into contact with the substrate for transferring the patterned compositions thereto, as described above.

It will be readily appreciated that the present method may facilitate proper registration between various patterns and the substrate. The patterns can be separated from one another on the flexible membrane in a manner that may further facilitate such registration.

FIG. 1E depicts several dashed line elements which reflect process steps directed to producing a membrane with a plurality of compositions, for later transfer to a substrate. After the first pattern grooves are filled 315, an additional set of grooves is produced 340 on the membrane by any desired manner. The second set of grooves is then loaded 345 with a second composition (the loading being optionally performed in repeated cycles of filling and drying a set of compositions which differ from the composition or set of compositions used to fill the grooves of previous pattern). Those process steps for patterns other than the first pattern may be repeated any desired number of times, as shown by dot-dashed line 355. Once all desired patterns have been formed in the membrane and loaded with the desired pastes of materials, the process continues 350 to contacting the membrane and subsequent transfer of the materials to the substrate (which involves steps such as previously described 320, 325, and 330), the final step 335 being adapted to sinter the materials of all transferred patterns. In some embodiments, the steps of the process are not performed in a continuous manner nor necessarily by the same entity. In certain embodiments, material may not be completely sintered, and in some embodiments temperatures and other environmental conditions are adjusted to prevent damage to the numerous compositions.

Depending on the end-use of the pattern of conductors, a rule/groove/conductor can have any suitable profile. When such profile has tapering faces, for instance as in trapezoidal profiles or triangular profiles, the base for such profiles can advantageously have a width $W_B$ between about 10 μm and about 25 μm. In some embodiments, the angle between the face of the conductor (the slope of the tapering face) and the substrate (represented by a in FIG. 5B) can be at least 25°, at least 30°, at least 40°, at least 45°, at least 50°, at least 60°, or at least at least 70°. Typically, the angle between the tapering face of such a conductor and the substrate is of at most 90°, 85°, at most 82.5°, at most 80°, at most 77.5°, or at most 75°. Advantageously, the angle formed by the face of the conductor and the substrate is between 20° and 90°, or in the range of 60° to 85°, 65° to 82.5° or 70° to 80°.

It will be appreciated, that while the angle formed by a side of the groove with respect to the surface of the membrane can be designed to be constant until the apex of a cross-section profile of the groove in the flexible membrane before loading, such angles may mildly vary during the process, in particular once the conductive pattern is transferred to its substrate and sintered thereon to form a pattern of conductors on an end-product having an electrically insulating substrate. For example, assuming a groove having a triangular cross-section profile, the faces of the triangle forming ab initio an angle of 45° with the surface of the membrane, a trace resulting from such a groove might have a less perfect triangular profile. Considering only half of its profile from the base of the insulating substrate to the top of the conductor (e.g., where the profile is symmetric on opposite sides of an axis traversing from the base to the top), the angle in a first segment can be either less than 45°, the profile of the conductor having an initial shallow slope, or on the contrary forming an angle of more than 45°, the profile of the conductor having an initial "stair" slope, such angles further varying as the tapering face reaches its apex. In some embodiments, the layer or layers of the conductor may follow the profile of the cross section of the conductor, regardless of whether the conductor includes one layer, two or more layers of the same sintered material, or two or more layers of different sintered materials. The profile can be mildly convex or concave, or with alternating convex, concave and straight segments. To take into account the profiles of the resulting conductors, which may form a variable angle as considered at different points along the slope formed between the basis (or in other words, base) and the top of the conductor, it can be preferred to consider the average of the angle as the mean of tan-1 of the profile slope (=derivative) at each sub-segment along the tapering face. Such value can also be referred to as the averaged slope. Using such method, and assuming that in the afore-detailed illustrative example, the angles of the triangularoid shape do average to 45°, even if fluctuating below and above this value along different sub-segments of the face, then the averaged slope of the half-profile would be of 1.

Hence in some embodiments, the averaged slope of one side of a conductor elevating from the electrically insulating substrate to the apex of the conductor (i.e. a tapering face) can be at least 0.50) (~26°, at least 0.75) (~37°, at least 0.85) (~40°, or at least 1) (45°, or at least 1.15) (~49°, at least 1.3 (~53°), at least 1.4) (~54°, at least 1.5) (~56°, or at least 1.7) (~60°. In some embodiments, the averaged slope is at most 10) (~84°, at most 8 (~83°), at most 6) (~80°, at most 4) (~76° or at most 2 (~63°). For example, an averaged slope range of 1.4 to 10, corresponds to an aspect ratio range of 0.7:1 to 5:1.

In the description and claims of the present disclosure, each of the verbs, "comprise" "include" and "have", and conjugates thereof, are used to indicate that the object or objects of the verb are not necessarily a complete listing of members, components, elements, steps or parts of the subject or subjects of the verb.

As used herein, the singular form "a", "an" and "the" include plural references and mean "at least one" or "one or more" unless the context clearly dictates otherwise.

Positional or motional terms such as "upper", "lower", "right", "left", "bottom", "below", "lowered", "low", "top", "above", "elevated", "high", "vertical", "horizontal", "backward", "forward", "upstream" and "downstream", as well as grammatical variations thereof, may be used herein for exemplary purposes only, to illustrate the relative positioning, placement or displacement of certain components, to indicate a first and a second component in present illustrations or to do both. Such terms do not necessarily indicate that, for example, a "bottom" component is below a "top" component, as such directions, components or both may be flipped, rotated, moved in space, placed in a diagonal orientation or position, placed horizontally or vertically, or similarly modified.

Unless otherwise stated, the use of the expression "and/or" between the last two members of a list of options for selection indicates that a selection of one or more of the listed options is appropriate and may be made.

Unless other stated, when the outer bounds of a range with respect to a feature of an embodiment of the present technology are noted in the disclosure, it should be understood that in the embodiment, the possible values of the feature may include the noted outer bounds as well as values in between the noted outer bounds. In the disclosure, unless otherwise stated, adjectives such as "substantially", "approximately" and "about" that modify a condition or relationship characteristic of a feature or features of an embodiment of the present technology, are to be understood to mean that the condition or characteristic is defined to within tolerances that are acceptable for operation of the embodiment for an application for which it is intended, or within variations expected from the measurement being performed and/or from the measuring instrument being used. Furthermore, unless otherwise stated the terms (e.g., numbers) used in this disclosure, even without such adjectives, should be construed as having tolerances which may depart from the precise meaning of the relevant term but would enable the invention or the relevant portion thereof to operate and function as described, and as understood by a person skilled in the art.

Certain marks referenced herein may be common law or registered trademarks of third parties. Use of these marks is by way of example and shall not be construed as descriptive or limit the scope of this disclosure to material associated only with such marks.

To the extent necessary to understand or complete the disclosure of the present invention, all publications, patents, and patent applications mentioned herein, including in particular the applications of the Applicant, are expressly incorporated by reference in their entirety by reference as is fully set forth herein.

While this disclosure has been described in terms of certain embodiments and generally associated methods, alterations and permutations of the embodiments and methods will be apparent to those skilled in the art. The present disclosure is to be understood as not limited by the specific examples described herein.

The invention claimed is:

1. A method of applying a pattern of electrical conductors to an electrically insulating substrate, the method comprising:
 (a) providing a flexible membrane having a pattern of grooves in a first surface of the membrane, the pattern corresponding at least partially to a desired pattern of electrical conductors to be applied to the substrate and the first surface of the membrane comprising a thermoplastic polymer and being sufficiently flexible to conform to the surface of the substrate upon application of a pressure;
 (b) loading into the grooves a transferable composition that includes, as composition components, particles of an electrically conductive material and a transferable adhesive, said loading being performed in one or more cycles such that on completion of the loading step the transferable composition substantially fills the grooves, level with the first surface of the membrane, and parts of the first surface between the grooves are substantially devoid of the composition;

(c) bringing the first surface of the membrane into contact with an electrically insulating surface of the substrate; and (d) applying pressure to the membrane to cause the composition loaded into the grooves in the first surface of the membrane to adhere to the electrically insulating substrate by virtue of the transferable adhesive in the composition and the membrane to remain attached to the substrate.

2. The method as claimed in claim 1, wherein the composition loaded into the grooves in step (b) comprises, as an additional composition component, a liquid carrier to form a wet composition, and wherein each cycle includes the steps of:

(i) applying an excess of the wet composition to the whole of the first surface of the flexible membrane;

(ii) removing excess wet composition from the first surface to leave the wet composition substantially only within the grooves in the first surface of the membrane; and (iii) substantially drying the wet composition within the grooves by removing the liquid carrier to leave dried composition.

3. The method as claimed in claim 1, wherein the components of the composition applied during different cycles of the loading step differ from one another in respect of relative proportions and/or materials.

4. The method as claimed in claim 1, wherein the electrically conductive material of the particles is for each cycle selected from the group consisting of metals, alloys, organometals, conductive polymers, conductive polymers precursors and salts thereof and combinations thereof.

5. The method as claimed in claim 1, wherein the transferable adhesive includes for each cycle at least one of (i) an organic binder, (ii) an organic adhesive that is a pressure and/or heat sensitive adhesive, and (iii) a glass frit.

6. The method as claimed in claim 1, wherein the flexible membrane fulfils at least one of the following features:

A—the membrane comprises at least one layer made of a formable plastics polymer capable of being embossed and/or cast;

B—the first surface of the membrane has a pattern of grooves embossed or cast therein;

C—the thermoplastic polymer comprised in the first surface of the membrane is a formable plastics polymer selected from the group consisting of cyclic olefin copolymer (COC), polyethylene (PE), cast polypropylene (CPP), and other type of polypropylene (PP), thermoplastic polyurethane (TPU), and combinations thereof;

D—the flexible membrane is a preformed membrane consisting of at least two layers, at least one of the layers constituting the first surface of the membrane where the thermoplastic polymer is selected from the group consisting of cyclic olefin copolymer (COC), polyethylene (PE), cast polypropylene (CPP), and other type of polypropylene (PP), thermoplastic polyurethane (TPU), and combinations thereof; and E—the first surface of the flexible membrane has a mean roughness Rz of 1 μm or less, 500 nm or less, 250 nm or less, or 100 nm or less.

7. The method as claimed in claim 1, wherein a release coating is applied to the grooves of the flexible membrane and dried thereon, prior to loading of the composition into the grooves.

8. The method as claimed in claim 1, wherein prior to bringing said flexible membrane and said substrate into contact according to step (c), an adhesive coating is applied to at least one of the electrically insulating substrate and the first surface of the membrane so as to coat any composition present in the grooves, said adhesive coating being dried prior to bringing into contact and a thickness of said dried adhesive coating optionally not exceeding 2 μm.

9. The method as claimed in claim 1, wherein the grooves of the pattern of grooves are substantially identical with one another or wherein at least two grooves in the pattern of grooves, or two different segments of a same groove, have different cross-sectional dimensions.

10. The method as claimed in claim 1, wherein:

A] step (d), at which pressure is applied, is performed at a temperature within a range of 60° C. to 200° C.; and/or wherein B] following step (d), the method further comprises cooling the flexible membrane and the electrically insulating substrate down to a predetermined temperature, wherein the pressure applied to the membrane in step (d) also causes the membrane to retain contact with the substrate until after the membrane and the substrate have cooled down to the predetermined temperature.

11. The method as claimed in claim 1, wherein if subsequent to said application of pressure of step (d), the composition transferred to the electrically insulating substrate is not electrically conductive, then the method further comprises: (e) rendering the transferred composition electrically conductive, thereby providing electrical conductors corresponding at least partially to the desired pattern.

12. The method as claimed in claim 11, wherein the composition is rendered electrically conductive in step (e) by applying sufficient energy to sinter the particles of electrically conductive material, said sintering being selected from thermal sintering, light induced sintering, microwave sintering, and electrical sintering.

13. The method as claimed in claim 1, wherein the flexible membrane is a continuous web.

14. The method as claimed in claim 1, wherein the first surface of the flexible membrane upon application of the pressure undergoes deformation mirroring at least part of the substrate surface topography including any texture, waviness or roughness of the substrate.

15. The method as claimed in claim 1, wherein the pattern of electrical conductors consists of shapes configured to form a plurality of conductive lines and at least one connector, being a) an intra-connector adapted to connect at least part of the conductive lines of the pattern one with another, and/or b) an inter-connector adapted to connect at least part of the pattern to i) an external circuitry and/or ii) a separate electrically conductive pattern.

16. The method as claimed in claim 1, wherein the pattern of grooves in the first surface of the flexible membrane provided in step (a) is formed by a complementary pattern of rules on a patterning element, the flexible membrane and patterning element optionally being in relative motion during the formation of the pattern.

17. The method as claimed in claim 16, wherein the formation of the pattern comprises advancing a continuous flexible membrane made of a formable plastics polymer capable of being embossed and/or cast between a die roller and a counter die, the die roller having protruding rules complementary to the pattern of grooves to be formed on the first surface of the membrane.

18. The method as claimed in claim 1, wherein a distance d between facing edges of adjacent grooves of the pattern of grooves is at least 7.5 µm, at least 10.0 µm, or at least 12.5 µm, and at most 2,000 µm, at most 1,500 µm, at most 1,000 µm, or at most 500 µm.

19. The method as claimed in claim 1, wherein the electrically insulating substrate is non-planar.

20. The method as claimed in claim 1, wherein the electrically insulating surface of the substrate is a surface layer on a body.

* * * * *